United States Patent
Ando

(10) Patent No.: US 12,199,121 B2
(45) Date of Patent: Jan. 14, 2025

(54) SOLID-STATE IMAGING DEVICE WITH INCREASED BONDING STRENGTH, AND METHOD OF MANUFACTURING THE SOLID-STATE IMAGING DEVICE

(71) Applicant: SONY SEMICONDUCTOR SOLUTIONS CORPORATION, Kanagawa (JP)

(72) Inventor: Yukihiro Ando, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 718 days.

(21) Appl. No.: 17/056,910

(22) PCT Filed: Jun. 3, 2019

(86) PCT No.: PCT/JP2019/021900
§ 371 (c)(1),
(2) Date: Nov. 19, 2020

(87) PCT Pub. No.: WO2019/235400
PCT Pub. Date: Dec. 12, 2019

(65) Prior Publication Data
US 2021/0210541 A1 Jul. 8, 2021

(30) Foreign Application Priority Data
Jun. 5, 2018 (JP) .................................. 2018-107747

(51) Int. Cl.
*H01L 27/146* (2006.01)
(52) U.S. Cl.
CPC .. *H01L 27/14634* (2013.01); *H01L 27/14603* (2013.01); *H01L 27/14636* (2013.01);
(Continued)
(58) Field of Classification Search
CPC ............ H01L 27/146–14698; H01L 24/00–09
See application file for complete search history.

(56) References Cited

U.S. PATENT DOCUMENTS

| | | | | |
|---|---|---|---|---|
| 2014/0145338 A1* | 5/2014 | Fujii | ................. | H01L 27/14634 257/762 |
| 2015/0054110 A1* | 2/2015 | Kashihara | ......... | H01L 27/14634 257/435 |

(Continued)

FOREIGN PATENT DOCUMENTS

| CN | 101515592 A | 8/2009 |
|---|---|---|
| CN | 102867847 A | 1/2013 |

(Continued)

OTHER PUBLICATIONS

International Search Report and Written Opinion prepared by the Japanese Patent Office on Aug. 14, 2019, for International Application No. PCT/JP2019/021900.

*Primary Examiner* — Didarul A Mazumder
*Assistant Examiner* — Gustavo G Ramallo
(74) *Attorney, Agent, or Firm* — Sheridan Ross PC

(57) ABSTRACT

A solid-state imaging device capable of preventing variation in bonding strength in a bonding plane between a first semiconductor substrate and a second semiconductor substrate is provided. The solid-state imaging device includes a first semiconductor substrate having a plurality of first conductors, and a second semiconductor substrate bonded to the first semiconductor substrate and having a plurality of second conductors In a bonding plane between the first and second semiconductor substrates, the device includes regions where the conductors overlap, regions where insulating films and the conductors overlap, and regions where the insulating films overlap. The proportion of areas where the first insulating films and the second insulating films are bonded together to the bonding area between the first semiconductor substrate and the second semiconductor substrate is constant before and after the first semiconductor (Continued)

substrate and the second semiconductor substrate are bonded together.

20 Claims, 22 Drawing Sheets

(52) U.S. Cl.
CPC .... *H01L 27/14643* (2013.01); *H01L 27/1469* (2013.01); *H01L 27/14609* (2013.01)

(56) References Cited

U.S. PATENT DOCUMENTS

| | | |
|---|---|---|
| 2015/0179691 A1 | 6/2015 | Yanagita et al. |
| 2016/0111386 A1 | 4/2016 | England et al. |
| 2016/0155766 A1 | 6/2016 | Kashihara |
| 2017/0040274 A1 | 2/2017 | England et al. |
| 2017/0062499 A1 | 3/2017 | Yanagita et al. |
| 2017/0243819 A1 | 8/2017 | Kagawa et al. |
| 2018/0096915 A1 | 4/2018 | Fujii et al. |
| 2018/0108690 A1 | 4/2018 | Yanagita et al. |
| 2018/0233435 A1 | 8/2018 | Fujii et al. |
| 2019/0115387 A1 | 4/2019 | Yamagishi et al. |

FOREIGN PATENT DOCUMENTS

| | | |
|---|---|---|
| CN | 103247603 A | 8/2013 |
| CN | 104425531 A | 3/2015 |
| CN | 106653720 A | 5/2017 |
| CN | 107046043 A | 8/2017 |
| JP | 2012-244101 | 12/2012 |
| JP | 2013033786 A | 2/2013 |
| JP | 2014-022561 | 2/2014 |
| JP | 2015-041677 | 3/2015 |
| TW | 201101471 A | 1/2011 |
| TW | 201218364 A | 5/2012 |
| TW | 201729371 A | 8/2017 |
| WO | WO 2016/056409 | 4/2016 |
| WO | WO 2017/169505 | 10/2017 |

* cited by examiner

A

B

C

SOLID-STATE IMAGING DEVICE WITH INCREASED BONDING STRENGTH, AND METHOD OF MANUFACTURING THE SOLID-STATE IMAGING DEVICE

CROSS REFERENCE TO RELATED APPLICATIONS

This application is a national stage application under 35 U.S.C. 371 and claims the benefit of PCT Application No. PCT/JP2019/021900 having an international filing date of 3 Jun. 2019, which designated the United States, which PCT application claimed the benefit of Japanese Patent Application No. 2018-107747 filed 5 Jun. 2018, the entire disclosures of each of which are incorporated herein by reference.

TECHNICAL FIELD

The present technology relates to a solid-state imaging device, a method of manufacturing the solid-state imaging device, and an electronic apparatus, and more particularly, relates to a technology for a solid-state imaging device formed by bonding a plurality of semiconductor chips together, a method of manufacturing the solid-state imaging device, and an electronic apparatus.

BACKGROUND ART

In recent years, digital cameras have become increasingly pervasive. With this, demand for solid-state imaging devices (image sensors) that are central components of digital cameras has been increasing more and more. For example, for solid-state imaging devices such as complementary metal-oxide semiconductor (CMOS) image sensors, miniaturization and thinning of the solid-state imaging devices have been studied as digital cameras have been increased in functionality and features.

Here, for example, a solid-state imaging device has been proposed which includes a first semiconductor substrate including a pixel region (a pixel array), a second semiconductor substrate including a logic circuit, and a light-shielding member formed between the first semiconductor substrate and the second semiconductor substrate (see Patent Document 1).

Furthermore, for example, a semiconductor device has been proposed which includes a first substrate having a bonded surface on which first electrodes and a first insulating film are exposed, an insulating thin film covering the bonded surface of the first substrate, and a second substrate having a bonded surface on which second electrodes and a second insulating film are exposed, the first electrodes and the second electrodes being electrically connected with the insulating thin film therebetween (see Patent Document 2).

Moreover, for example, a solid-state imaging device has been proposed which includes a laminated semiconductor chip in which a pixel array and a multilayer wiring layer are formed in a first semiconductor chip part, a logic circuit and a multilayer wiring layer are formed in a second semiconductor chip part, and the multilayer wiring layers are electrically connected face-to-face, and a light-shielding layer formed near a junction between the first semiconductor chip part and the second semiconductor chip part (see Patent Document 3).

CITATION LIST

Patent Documents

Patent Document 1: Japanese Patent Application Laid-Open NO. 2012-64709

Patent Document 2: Japanese Patent Application Laid-Open No. 2013-73988

Patent Document 3: Japanese Patent Application Laid-Open No. 2012-164870

SUMMARY OF THE INVENTION

Problems to be Solved by the Invention

By the way, if a bonding misalignment occurs when a first semiconductor substrate and a second semiconductor substrate are bonded together, the stability of bonding strength decreases in a bonding plane. Then, the decrease in the stability of the bonding strength causes variation in the bonding strength, which can result in the possibility of occurrence of voids in the bonding plane.

Therefore, the present technology has been made in view of such circumstances, and its object is to provide a solid-state imaging device capable of preventing variation in bonding strength in a bonding plane between a first semiconductor substrate and a second semiconductor substrate, a method of manufacturing the solid-state imaging device, and an electronic apparatus.

Solutions to Problems

As a result of earnest research to solve the above-mentioned object, the present inventor has succeeded in preventing variation in bonding strength in a bonding plane between a plurality of semiconductor substrates, and has come to complete the present technology.

Specifically, the present technology first provides a solid-state imaging device including:
 a first semiconductor substrate in which a plurality of first conductors is formed; and
 a second semiconductor substrate which is bonded to the first semiconductor substrate and in which a plurality of second conductors is formed,
 the solid-state imaging device including
 in a bonding plane between the first semiconductor substrate and the second semiconductor substrate, regions where the first conductors and the second conductors overlap each other, regions where first insulating films formed at the first conductors and the second conductors overlap each other, regions where second insulating films formed at the second conductors and the first conductors overlap each other, and regions where the first insulating films and the second insulating films overlap each other,
 the solid-state imaging device being arranged such that a proportion of areas where the first insulating films and the second insulating films are bonded together to a bonding area between the first semiconductor substrate and the second semiconductor substrate is constant before and after the first semiconductor substrate and the second semiconductor substrate are bonded together.

In the solid-state imaging device according to the present technology, at least some of the plurality of first conductors may be arranged substantially evenly, and
 at least some of the plurality of second conductors may be arranged such that distance between the second conductors adjacent to each other varies in a region of the substantially even arrangement.

In the solid-state imaging device according to the present technology, some of the plurality of second conductors may be arranged to be moved by a predetermined proportion of a minimum unit of repeating units in which the first conductors are repeatedly arranged, and may be arranged repeatedly. Further, the predetermined proportion may be ½ of the minimum unit.

In the solid-state imaging device according to the present technology, at least some of the plurality of second conductors may be arranged with a width of the second conductors that is an integral multiple of a repeating unit in which the first conductors are repeatedly arranged, in the substantially even arrangement region.

In the solid-state imaging device according to the present technology, at least some of the plurality of second conductors may be arranged such that a repeating unit in which the second conductors are repeatedly arranged is (an integer+½) times a repeating unit in which the first conductors are repeatedly arranged, in the substantially even arrangement region.

In the solid-state imaging device according to the present technology, the plurality of second conductors may be formed in a direction different from a direction in which the plurality of first conductors is formed. Further, in the solid-state imaging device according to the present technology, the plurality of second conductors may be formed in a direction going straight to a direction in which the plurality of first conductors is formed.

Further, the present technology provides a method of manufacturing a solid-state imaging device, including:
  forming a plurality of first conductors in a first semiconductor substrate;
  forming a plurality of second conductors in a second semiconductor substrate bonded to the first semiconductor substrate; and
  forming, in a bonding plane between the first semiconductor substrate and the second semiconductor substrate, regions where the first conductors and the second conductors overlap each other, regions where first insulating films formed at the first conductors and the second conductors overlap each other, regions where second insulating films formed at the second conductors and the first conductors overlap each other, and regions where the first insulating films and the second insulating films overlap each other,
  in which the solid-state imaging device is arranged such that a proportion of areas where the first insulating films and the second insulating films are bonded together to a bonding area between the first semiconductor substrate and the second semiconductor substrate is constant before and after the first semiconductor substrate and the second semiconductor substrate are bonded together.

Further, the present technology provides an electronic, apparatus equipped with a solid-state imaging device,
  the solid-state imaging device including at least a first semiconductor substrate in which a plurality of first conductors is formed, and
  a second semiconductor substrate which is bonded to the first semiconductor substrate and in which a plurality of second conductors is formed,
  the solid-state imaging device including, in a bonding plane between the first semiconductor substrate and the second semiconductor substrate, regions where the first conductors and the second conductors overlap each other, regions where first insulating films formed at the first conductors and the second conductors overlap each other, regions where second insulating films formed at the second conductors and the first conductors overlap each other, and regions where the first insulating films and the second insulating films overlap each other,
  the solid-state imaging device being arranged such that a proportion of areas where the first insulating films and the second insulating films are bonded together to a bonding area between the first semiconductor substrate and the second semiconductor substrate is constant before and after the first semiconductor substrate and the second semiconductor substrate are bonded together.

Effects of the Invention

The present technology can prevent variation in bonding strength in a bonding plane between a first semiconductor substrate and a second semiconductor substrate. Note that the effects of the present technology are not necessarily limited to the above effect, and may include any effect described in the present technology.

MODE FOR CARRYING OUT THE INVENTION

Figure 1:
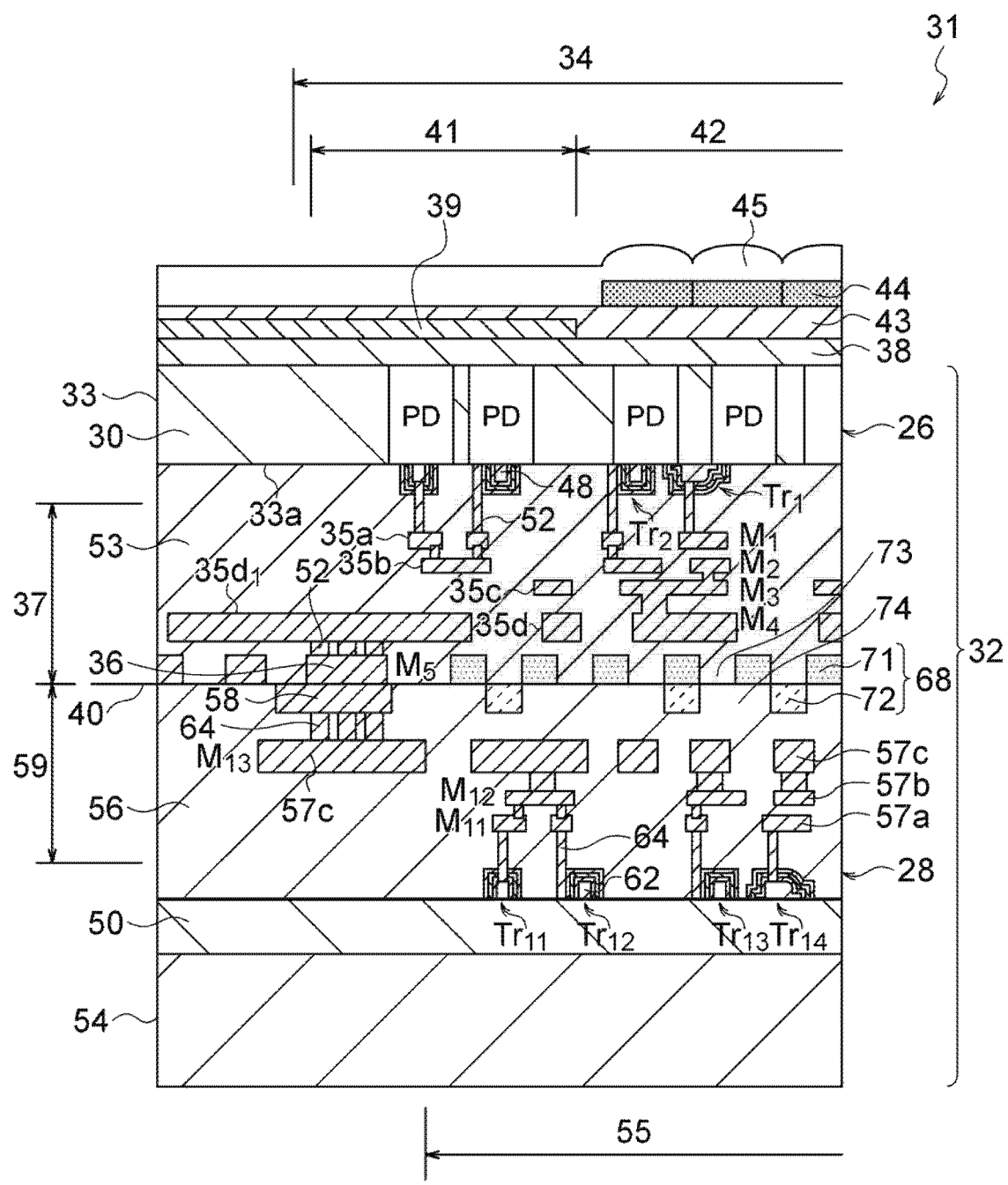
FIG. 1 is a cross-sectional view showing the configuration of a solid-state imaging device that is an example of a solid-state imaging device according to a first embodiment to which the present technology is applied.

Hereinafter, a suitable mode for carrying out the present technology will be described with reference to the drawings. Note that embodiments described below show an example of a typical embodiment of the present technology, and these do not narrow the interpretation of the scope of the present technology. The description will be made in the following order.

1. Overview of present technology
2. Solid-state imaging device in first embodiment
3. Solid-state imaging device in second embodiment
4. Solid-state imaging device in third embodiment
5. Solid-state imaging device in fourth embodiment
6. Solid-state imaging device in fifth embodiment
7. Solid-state imaging device in sixth embodiment
8. Electronic apparatus in seventh embodiment
9. Examples of use of solid-state imaging device to which present technology is applied 1. Overview of Present Technology The present technology relates to a solid-state imaging device in which a first semiconductor substrate and a second semiconductor substrate are bonded together, a method of manufacturing the solid-state imaging device, and an electronic apparatus. The present technology can prevent variation in bonding strength in a bonding plane between the first semiconductor substrate and the second semiconductor substrate when the first semiconductor substrate and the second semiconductor substrate are bonded together.

It is known that in a case where a first semiconductor substrate and a second semiconductor substrate are bonded together, voids (air bubbles) that cannot, be bonded are partially formed in a bonding plane between the first semiconductor substrate and the second semiconductor substrate. Specifically, in a solid-state imaging device that does not have regions where an insulating film of a first semiconductor substrate and an insulating film of a second semiconductor substrate are directly bonded together, bonding strength immediately after bonding is low in a bonding plane. Then, if the bonding strength in the bonding plane is low, voids (air bubbles) are likely to be formed in the bonding plane between the first semiconductor substrate and the second semiconductor substrate. These voids formed immediately after the bonding are difficult to reduce even if annealing is performed to increase the bonding strength. Further, if voids are formed in the bonding plane, those portions have not been able to be bonded, and thus can cause separation in a process of thinning a Si substrate of the first semiconductor substrate performed after wafer bonding.

A primary cause of voids is difference in the power of bonding strength. For example, bonding strength between copper and copper and bonding strength immediately after bonding in a region where copper and an insulating film are directly bonded together are lower than bonding strength in a region where an insulating film and an insulating film are directly bonded together. Therefore, in order to reduce the possibility of separation between the first semiconductor substrate and the second semiconductor substrate, it is necessary to provide above a certain proportion of areas where the insulating film of the first semiconductor substrate and the insulating film of the second semiconductor substrate are directly bonded together, to the bonding area between the first semiconductor substrate and the second semiconductor substrate.

Here, a decrease in bonding strength that is a factor causing voids will be described with reference to the drawings.

Figure 26:
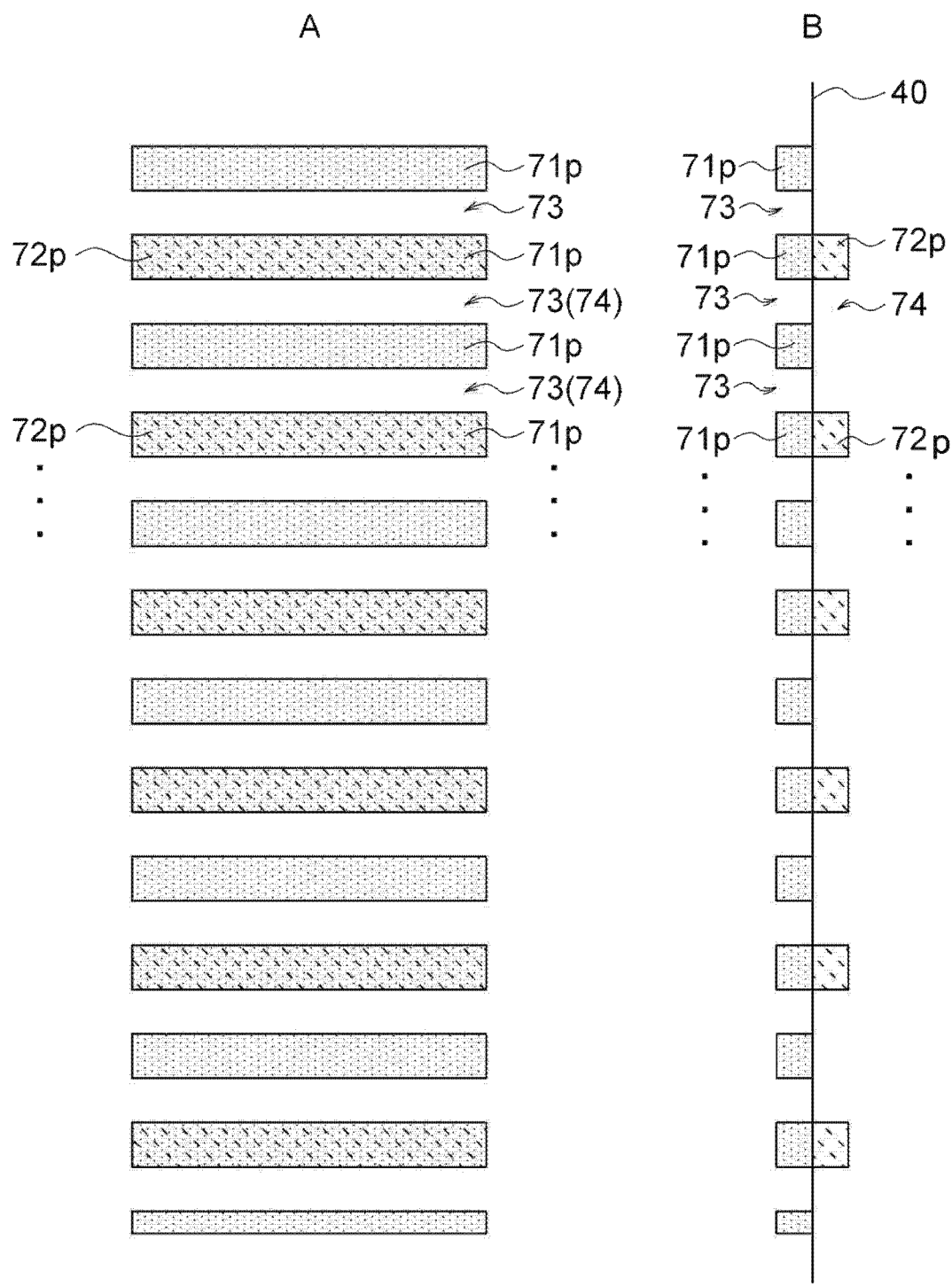
FIG. 26 is an explanatory diagram showing a layout configuration in which a decrease in bonding strength occurs in an imaginable bonding plane in a solid-state imaging device.

FIGS. 26A and 26B are explanatory diagrams showing a layout in which a decrease in bonding strength occurs in an imaginable bonding plane in a solid-state imaging device. Note that FIG. 26A is a plan view of the layout as seen from the top in which a plurality of first conductors 71p and a plurality of second conductors 72p are arranged. Further, FIG. 26B is an explanatory diagram showing a cross section of the layout in which the plurality of first conductors 71p and the plurality of second conductors 72p are arranged. Note that the first conductors 71p and the second conductors 72p may each form a light-shielding portion. Thus, the first conductors 71p or the second conductors 72p may be referred to as light-shielding portions, or the first conductors 71p and the second conductors 72p may be collectively referred to as a light-shielding layer.

As shown in FIG. 26A, each of the plurality of first conductors 71p is arranged substantially evenly with a predetermined pitch in a horizontally striped pattern. Furthermore, each of the plurality of second conductors 72p is also arranged substantially evenly with a predetermined pitch in a horizontally striped pattern.

Each of the plurality of first conductors 71p has a first insulating film 73. Furthermore, each of the plurality of second conductors 72p also has a second insulating film 74. The first insulating films 73 and the second insulating films 74 each form a bonding region in a bonding plane. For example, as shown in FIG. 26B, the first conductors 71p and the second conductors 72p are arranged such that at least some of them are bonded to each other. Note that the metallic density of the first conductors 71p is 50%, and the metallic density of the second conductors 72p is 25%.

In this layout of the solid-state imaging device, the proportion of the areas of bonded portions between the first insulating films 73 and the second insulating films 74 with a high bonding strength to the bonding area between the first semiconductor substrate including the first conductors 71p and the second semiconductor substrate including the second conductors 72p is 50%. Note that, the proportion of the areas of the bonded portions means the proportion of the areas occupied by the bonded portions between the first insulating films 73 and the second insulating films 74 of the area occupied by the first insulating films 73 and the second insulating films 74 in the bonding plane 40.

Then, in such a layout, if a bonding misalignment occurs between the first semiconductor substrate including the first conductors 71p and the second semiconductor substrate including the second conductors 72p, the proportion of the areas of bonded portions between the first insulating films 73 and the second insulating films 74 decreases.

Figure 27:
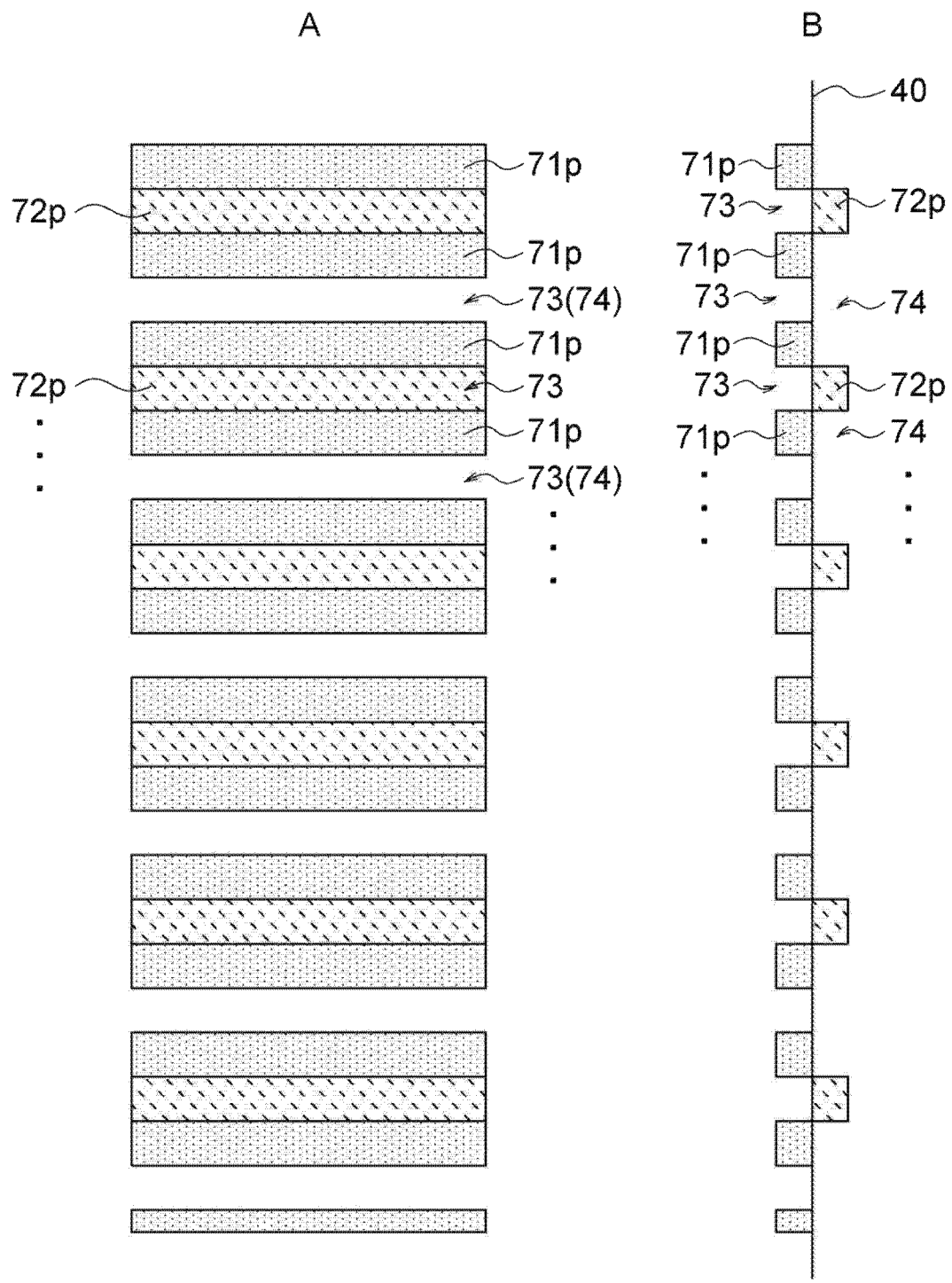
FIG. 27 is an explanatory diagram showing a layout configuration in a case where a bonding misalignment occurs between a first semiconductor substrate and a second semiconductor substrate of the solid-state imaging device.

FIGS. 27A and 27B are explanatory diagrams showing an example in a case where a bonding misalignment occurs between the first semiconductor substrate and the second semiconductor substrate of the solid-state imaging device. If a bonding misalignment occurs in the bonding plane 40 between the first semiconductor substrate and the second semiconductor substrate, the proportion of the areas of bonded portions between the first insulating films 73 and the second insulating films 74 to the bonding area between the first semiconductor substrate and the second semiconductor substrate decreases from 50% to 25%.

If a bonding misalignment occurs between the first semiconductor substrate and the second semiconductor substrate like this, the proportion of areas occupied by bonded portions between the first insulating films 73 and the second insulating films 74 decreases, so that the bonding strength decreases, causing variation in bonding strength in the bonding plane 40.

In particular, due to a bonding misalignment between the first semiconductor substrate and the second semiconductor substrate, the proportion of the areas of bonded portions between the first insulating films 73 and the second insulating films 74 to the bonding area between the first semiconductor substrate and the second semiconductor substrate changes, and thus the bonding strength in the bonding plane 40 has been unstable. In other words, the bonding strength has varied between 50% and 25%.

Therefore, the present technology has been made in view of the above circumstances, and is a technology to prevent variation in bonding strength in a bonding plane between a first semiconductor substrate and a second semiconductor substrate.

A solid-state imaging device according to the present technology includes a first semiconductor substrate in which a plurality of first conductors is formed, and a second semiconductor substrate which is bonded to the first semiconductor substrate and in which a plurality of second conductors is formed, and includes, in a bonding plane between the first semiconductor substrate and the second semiconductor substrate, regions where the first conductors and the second conductors overlap, regions where first insulating films formed at the first conductors and the second conductors overlap, regions where second insulating films formed at the second conductors and the first conductors overlap, and regions where the first insulating films and the second insulating films overlap. Further, the solid-state imaging device is arranged such that the proportion of areas where the first insulating films and the second insulating films are bonded together to the bonding area between the first semiconductor substrate and the second semiconductor substrate is constant before and after the first semiconductor substrate and the second semiconductor substrate are bonded together.

The present technology can prevent, variation in the bonding strength in the bonding plane between the first semiconductor substrate and the second semiconductor substrate, and thus can avoid formation of voids (air bubbles). Further, since variation in the bonding strength can be prevented, a situation that causes separation can be avoided in a process of thinning a Si substrate of the first semiconductor substrate performed after wafer bonding.

2. Solid-State Imaging Device in First Embodiment

Configuration of Solid-State Imaging Device

FIG. 1 shows a solid-state imaging device 31 that is an example of a solid-state imaging device according to a first embodiment of the present technology. FIG. 1 is a cross-sectional view of the solid-state imaging device 31.

The solid-state imaging device 31 includes a first semiconductor substrate 33 in which a plurality of first conductors 71 is formed, and a second semiconductor substrate 54 which is bonded to the first semiconductor substrate 33 and in which a plurality of second conductors 72 is formed. The solid-state imaging device 31 includes, in a bonding plane 40 between the first semiconductor substrate 33 and the second semiconductor substrate 54, regions where the first conductors 71 and the second conductors 72 overlap, regions where first insulating films 73 formed at the first conductors 72 and the second conductors 72 overlap, regions where second insulating films 74 formed at the second conductors 72 and the first conductors 71 overlap, and regions where the first insulating films 73 and the second insulating films 74 overlap. The solid-state imaging device 31 is arranged such that the proportion of areas where the first insulating films 73 and the second insulating films 74 are bonded together to the bonding area between the first semiconductor substrate 33 and the second semiconductor substrate 54 is constant before and after the first semiconductor substrate 33 and the second semiconductor substrate 54 are bonded together.

Furthermore, in the solid-state imaging device 31 according to the first embodiment of the present technology, at least some of the plurality of first conductors 71 are arranged substantially evenly, and at least some of the plurality of second conductors 72 are arranged such that the distance between the second conductors 72 adjacent to each other varies in the substantially even arrangement region.

Note that the substantially even arrangement means that in a case where the plurality of first conductors 71 and the plurality of second conductors 72 are arranged repeatedly by two first conductors 71 and two second conductors 72, respectively, they are arranged with a ±10% tolerance on a first predetermined spacing in the repeated arrangement. Further, it means that also in a case where the plurality of first conductors 71 and the plurality of second conductors 72 are arranged repeatedly by one group formed by three or more first conductors 71 and one group formed by three or more second conductors 72, respectively, they are arranged with a ±10% tolerance on a second predetermined spacing in the repeated arrangement. Note that in the following description, even arrangement may include substantially even arrangement.

Figure 2:
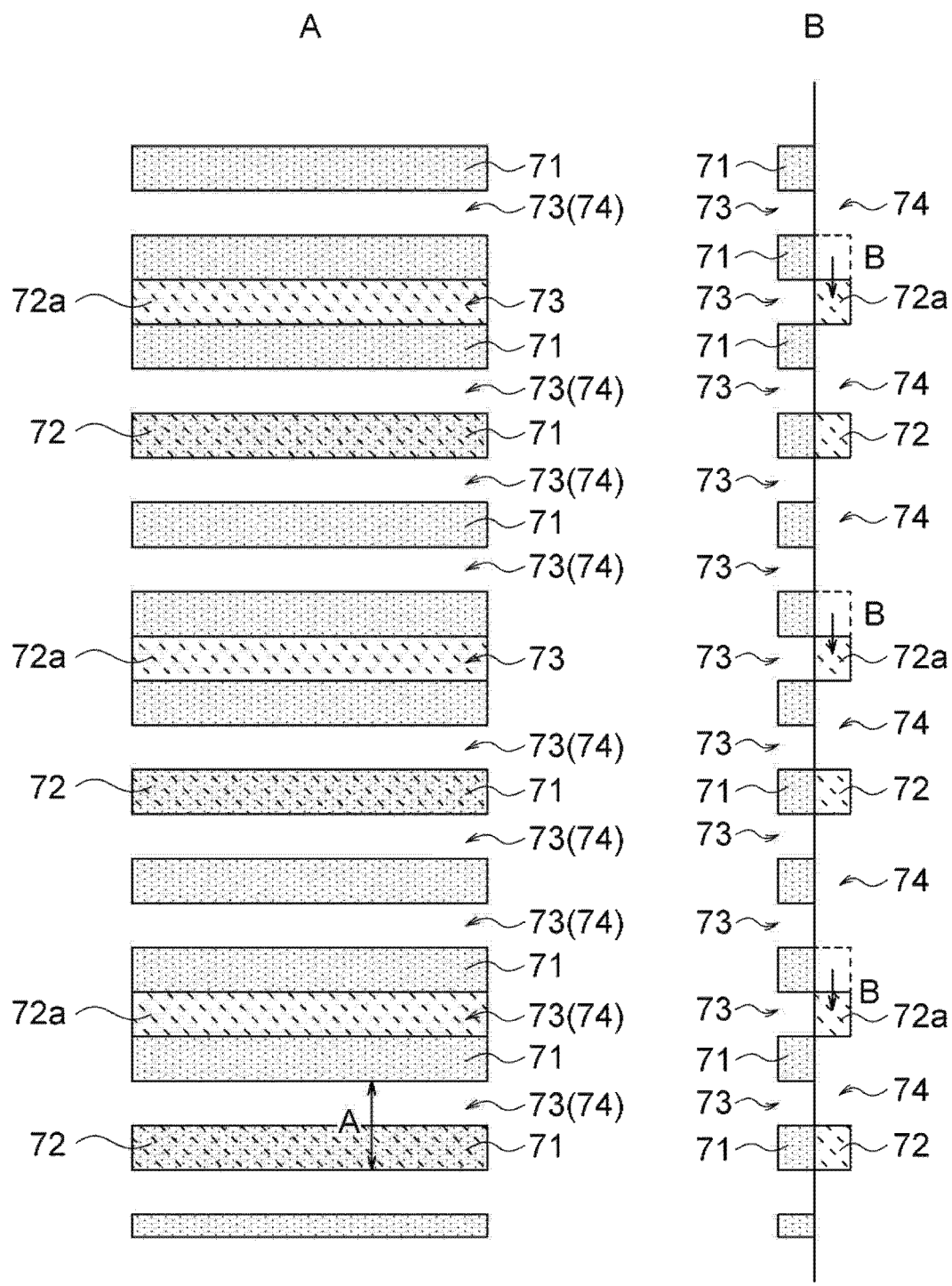
FIG. 2 is an explanatory diagram showing the layout configuration of light-shielding portions of a first semiconductor substrate and a second semiconductor substrate in the solid-state imaging device according to the first embodiment to which the present technology is applied.

FIGS. 2A and 2B show the layout configuration of the first conductors 71 and the second conductors 72 of the solid-state imaging device according to the first embodiment of the present technology. FIGS. 2A and 2B are explanatory diagrams showing the layout of the first conductors 71 and the second conductors 72 of the first semiconductor substrate 33 and the second semiconductor substrate 54 in the solid-state imaging device.

As shown in FIG. 2A, each of the plurality of first conductors 71 in the first embodiment is evenly arranged with a predetermined pitch in a horizontally striped pattern including the first insulating films 73, as seen from the top surface. Furthermore, each of the plurality of second conductors 72 in the first embodiment is also arranged with a predetermined pitch in a horizontally striped pattern including the second insulating films 74. Note that it is only required that at least some of the plurality of first conductors 71 are evenly arranged, and at least some of the plurality of second conductors 72 are also arranged in a striped pattern.

Furthermore, at least some of the second conductors 72 are arranged such that the distance between the second conductors 72 adjacent to each other, that is, the second insulating film 74 varies in a region where the first conductors 71 are evenly arranged. Furthermore, a distance A shown in FIG. 2A indicates the pitch of the first conductors 71, that is, a repeating unit in which the first conductors 71 are repeatedly arranged.

FIG. 2B is an explanatory diagram showing a cross section of the layout of the first conductors 71 and 72 of the solid-state imaging device shown in FIG. 2A. As shown in FIG. 2B, the plurality of first conductors 71 is evenly arranged in the bonding plane 40. On the other hand, the plurality of second conductors 72 are arranged such that some of the second conductors 72 (second conductors 72a) are moved in the bonding plane 40 by a predetermined proportion. The predetermined proportion in the first embodiment is, for example, ½ of a minimum pitch of the first conductors 71 (which means the distance A) (this distance is indicated as a distance B).

Note that FIGS. 2A and 2B show a layout in a case where the metallic density of the first conductors 71 is 50% and the metallic density of the second conductors 72 is 25%. Furthermore, the pitches mean repeating units in which the first conductors 71 and the second conductors 72 are repeatedly arranged, and the smallest repeating unit of the repeating units is referred to as a minimum pitch.

In the first embodiment, even if a bonding misalignment occurs between the first semiconductor substrate 33 and the second semiconductor substrate 54, some of the plurality of second conductors 72 (the second conductors 72a) are moved by ½ of the minimum pitch of the first conductors 71, in other words, by the distance B, to be arranged in the bonding plane 40. Since the second conductors 72a are moved by ½ of the minimum pitch of the first conductors 71 to be arranged in the bonding plane 40, even if a bonding misalignment occurs, the proportion of bonding areas between the first insulating films 73 and the second insulating films 74 does not change. In this case, the proportion of the areas of bonded portions between the first insulating films 73 and the second insulating films 74 to the bonding area between the first semiconductor substrate 33 and the second semiconductor substrate 54 is 37.5% (constant).

In the first embodiment of the present technology, the numerical value is lower than the proportion (50%) of the areas of bonded portions in the case of the substantially even arrangement in the solid-state imaging device described in the overview of the present technology. However, even if a bonding misalignment occurs between the first semiconductor substrate 33 and the second semiconductor substrate 54, the first embodiment of the present technology, in which the proportion of the areas of bonded portions between the first insulating films 73 and the second insulating films 74 to the bonding area between the first semiconductor substrate 33 and the second semiconductor substrate 54 does not change from 37.5%, thus can prevent variation in bonding strength in the bonding plane 40.

Note that, in the first embodiment of the present technology, in FIGS. 2A and 2B, one second conductor 72a in every two second conductors 72 is moved in the bonding plane 40, and the second conductors 72a corresponding to half the total number of the second conductors 72 are arranged to be moved. However, the first embodiment is not limited to this. Even if the number of second conductors 72a arranged to be moved is changed, the first embodiment can prevent a change in the proportion of the areas of bonded portions between the first insulating films 73 and the second insulating films 74.

Furthermore, in the first embodiment, in FIGS. 2A and 2B, some of the second conductors 72 (the second conductors 72a) are repeatedly arranged such that they are moved by ½ (the distance B) of the minimum pitch (the distance A) of the repeating unit in which the first conductors 71 are repeatedly arranged. However, in the first embodiment, the proportion by which the second conductors 72a are arranged to be moved is not limited to ½ of the minimum pitch of the first conductors 71. For example, only by arranging some of the second conductors 72 (the second conductors 72a) to be moved by other than ½ of the minimum pitch of the first conductors 71, a change in the proportion of the areas of bonded portions between the first insulating films 73 and the second insulating films 74 can be reduced, so that variation in bonding strength in the bonding plane 40 can be prevented.

Figure 3:
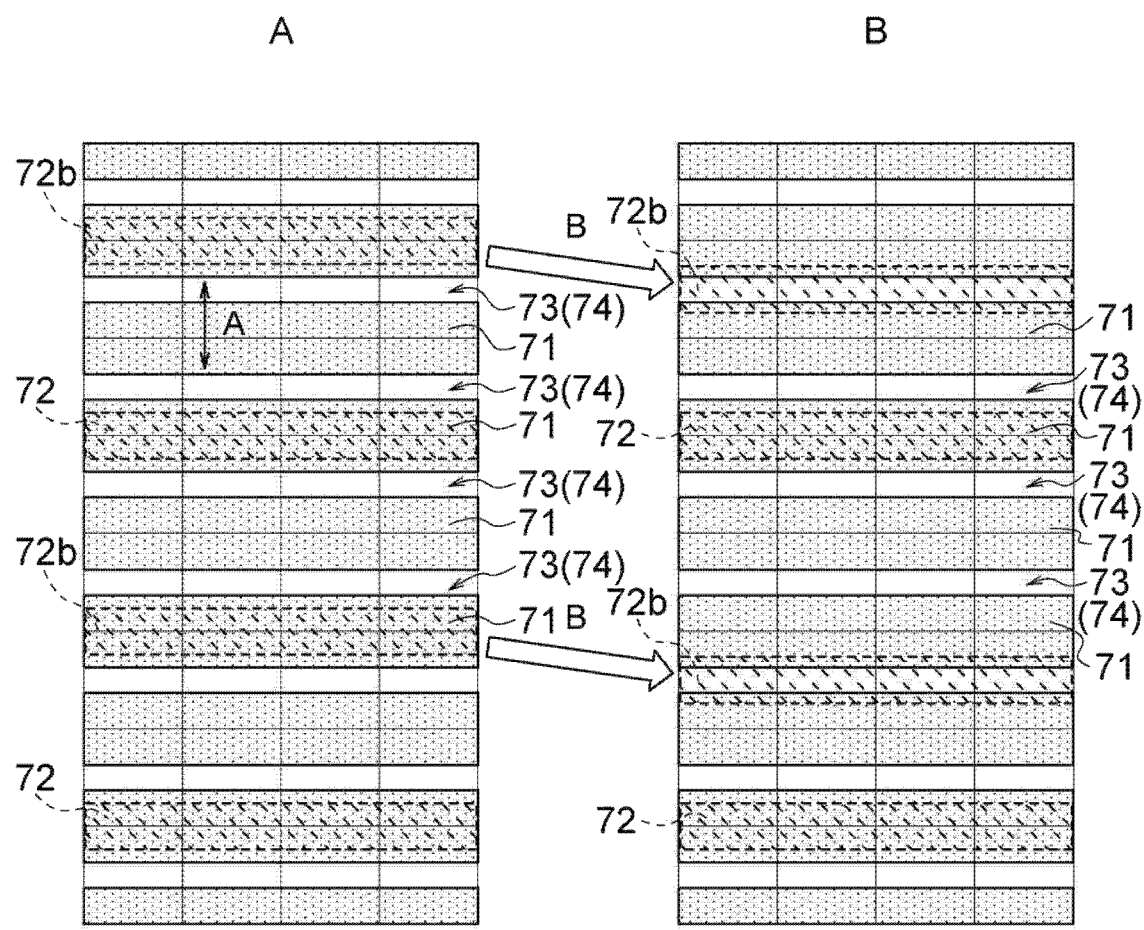
FIG. 3 is an explanatory diagram showing the layout configuration of the light-shielding portions changed in metallic density in the solid-state imaging device according to the first embodiment to which the present technology is applied.

Furthermore, FIGS. 2A and 2B illustrated as the first embodiment are the example of the layout where the metallic density of the first conductors 71 is 50% and the metallic density of the second conductors 72 is 25%. The metallic densities are not limited to these, and other metallic densities can be used. For example, a layout with another metallic density will be described with reference to FIGS. 3A and 3B.

FIG. 3A shows a case where the metallic density of the first conductors 71 is 75%, and the first insulating films 73 constitute 25%. Furthermore, the metallic density of the second conductors 72 is kept at 25%, and the plurality of first conductors 71 and the plurality of second conductors 72 are each substantially evenly arranged. Furthermore, in FIG. 3B, some of the second conductors 72 (second conductors 72b) are arranged to be moved by ½ (the distance B) of the minimum pitch (the distance A) of the first conductors 71.

In this case, the proportion of the areas of bonded portions between the first insulating films 73 and the second insulating films 74 to the bonding area between the first semiconductor substrate 33 and the second semiconductor substrate 54 is 18.75% (constant). Then, even if a bonding misalignment occurs between the first semiconductor substrate 33 and the second semiconductor substrate 54, the proportion of the areas of bonded portions between the first insulating films 73 and the second insulating films 74 does not change from 18.75%. Thus, variation in bonding strength in the bonding plane 40 can be prevented.

Figure 4:
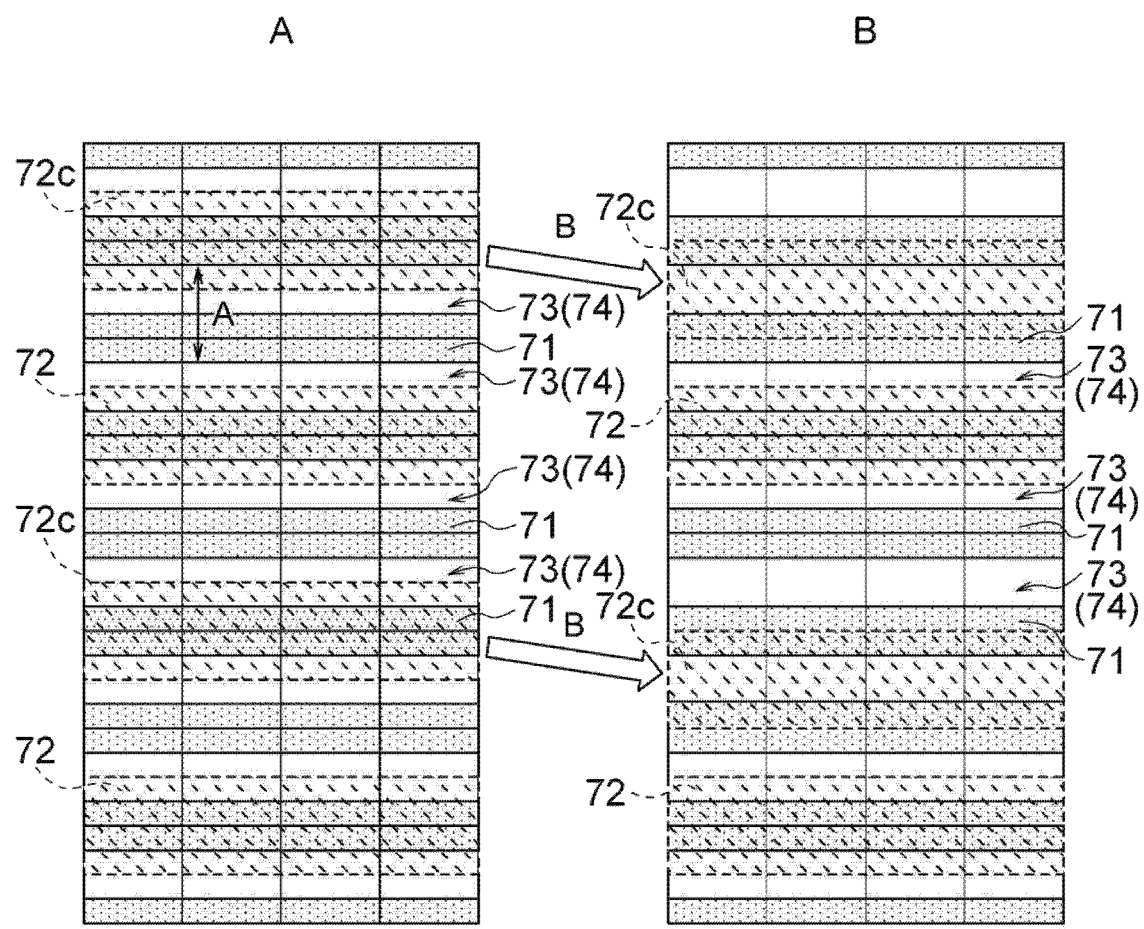
FIG. 4 is an explanatory diagram showing the layout configuration of the light-shielding portions changed in metallic density in the solid-state imaging device according to the first embodiment to which the present technology is applied.

Next, as the first embodiment, a layout in a case where the metallic density of the first conductors 71 is 50% and the metallic density of the second conductors 72 is 50% will be described with reference to FIGS. 4A and 4B.

In FIG. 4A, since the metallic density of the first conductors 71 is 50%, the first conductors 71 are arranged substantially evenly as in FIG. 2A. On the other hand, the second conductors 72 also have a metallic density of 50% and are arranged substantially evenly. Furthermore, in FIG. 4B, some of the second conductors 72 (second conductors 720) are arranged to be moved by ½ (the distance B) of the minimum pitch (the distance A) of the first conductors 71.

In this case, the proportion of the areas of bonded portions between the first insulating films 73 and the second insulating films 74 to the bonding area between the first semiconductor substrate 33 and the second semiconductor substrate 54 is 25% (constant). Then, even if a bonding misalignment occurs between the first semiconductor substrate 33 and the second semiconductor substrate 54, the proportion of the areas of bonded portions between the first insulating films 73 and the second insulating films 74 does not change from 25%. Thus, variation in bonding strength in the bonding plane 40 can be prevented.

Figure 5:
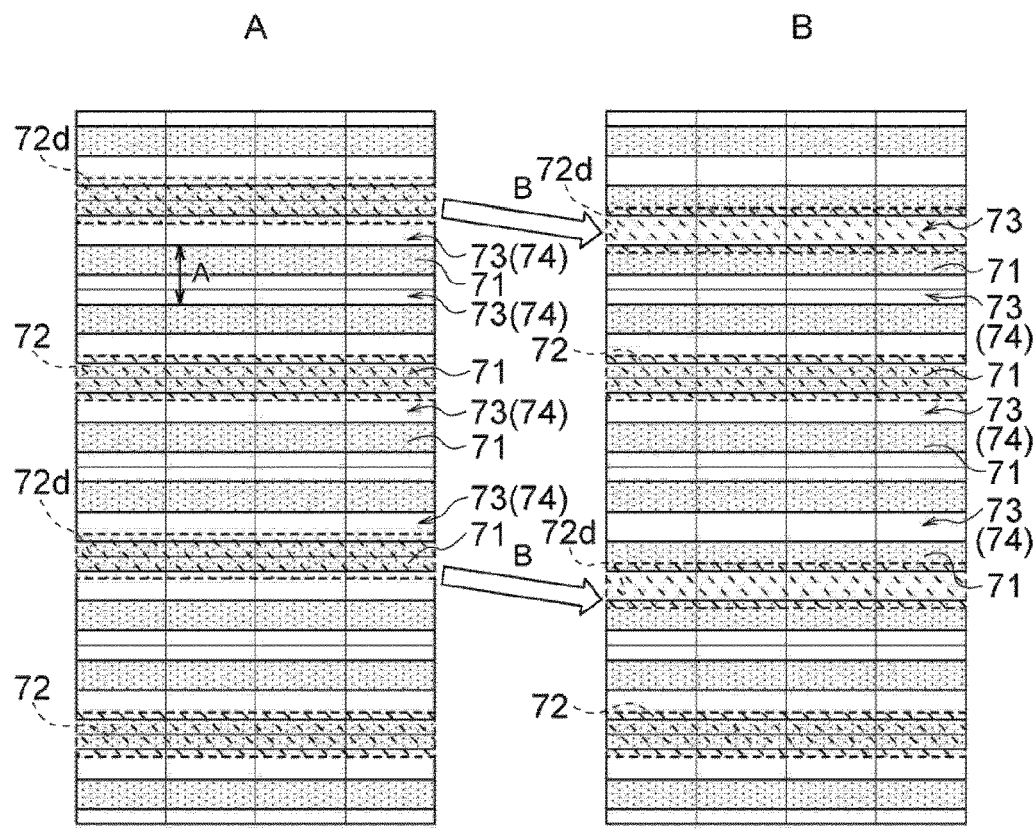
FIG. 5 is an explanatory diagram showing the layout configuration of the light-shielding portions in which some light-shielding portions of the light-shielding portions on one side are moved according to the ratio in number of the light-shielding portions in the solid-state imaging device according to the first embodiment to which the present technology is applied.

Furthermore, in FIGS. 2A to 4B illustrated as the first embodiment of the present technology, the ratio in number between the first conductors 71 and the second conductors 72 in the bonding plane 40 is two to one, but the first embodiment is not limited to the ratio in number between the first conductors 71 and the second conductors 72. For example, a case where the ratio in number between the first conductors 71 and the second conductors 72 in the bonding plane 40 is three to one will be described with reference to the drawings. Note that the description will be made with reference to FIGS. 5A and 5B, in which the metallic density of the first conductors 71 is 50%, and the metallic density of the second conductors 72 is 25%.

In FIG. 5A, the first conductors 71 are arranged substantially evenly in a striped pattern. Furthermore, the second conductors 72 are also arranged substantially evenly in a striped pattern. Then, the ratio of the number of first conductors 71 to the number of second conductors 72 is three to one. In FIG. 5B, for the second conductors 72, some of the second conductors 72 (second conductors 72d) are arranged to be moved by ½ (the distance B) of the minimum unit (the distance A) of the first conductors 71 in the bonding plane 40. In this case, the proportion of the areas of bended portions between the first insulating films 73 and the second insulating films 74 is 37.5% (constant) in the bonding area between the first semiconductor substrate 33 and the second semiconductor substrate 54. Even if a bonding misalignment occurs, the proportion of the areas of bonded portions between the first insulating films 73 and the second insulating films 74 does not change from 37.5%. Thus, the first embodiment of the present technology can prevent variation in bonding strength in the bonding plane 40.

Note that the first conductors 71 and the second conductors 72 covering the first insulating films 73 are formed so as to overlap each other. When a connecting wire 36 and a connecting wire 58 are directly bonded together (see FIG. 1 or 2), the first conductors 71 and the second conductors 72 are directly bonded together at the overlapping portions at the same time. Furthermore, for the first conductors 71 and the second conductors 72, those on one side are wires having the first insulating films 73 or the second insulating films 74, and those on the other side are formed in a shape to cover the first insulating films 73 or the second insulating films 74. Note that various patterns are conceivable for the pattern of the first insulating films 73 according to the present technology, which is not limited to the horizontally striped pattern shown in FIGS. 2A and 2B.

Furthermore, bonded portions between the first insulating films 73 and the second insulating films 74 correspond to an interlayer insulating film described later. Therefore, bonding between the first insulating films 73 and the second insulating films 74 to constitute an interlayer insulating film is performed by plasma bonding to form an insulating film.

Returning to FIG. 1, the configuration of the solid-state imaging device 31 according to the first embodiment of the present technology will be described. The solid-state imaging device 31 includes a laminated semiconductor chip 32 with a first semiconductor chip part 26 and a second semiconductor chip part 28 bonded together. The first semiconductor chip part 26 and the second semiconductor chip part 28 are bonded together such that their respective multilayer wiring layers, which will be described later, face each other and connecting wires are directly bonded together.

In the first semiconductor chip part 26, a pixel array 34 with a plurality of pixels each including a photodiode PD to serve as a photoelectric converter and a plurality of pixel transistors Tr1 and Tr2 two-dimensionally arranged in rows is formed in the first semiconductor substrate 33 including silicon that has been thinned. Further, a plurality of MOS transistors constituting a control circuit 24 is formed in the first semiconductor substrate 33, which will be described later. On the front 33a side of the first semiconductor substrate 33, a multilayer wiring layer 37 is formed in which wires 35 [35a to 35d] and the connecting wire 36 including a plurality of, in this example, five layers of metal M1 to M5 are arranged with an interlayer insulating film 53 therebetween. For the wires 35 and the connecting wire 36, copper (Cu) wires formed by a dual damascene process are used. On the back side of the first semiconductor substrate 33, a light-shielding film 39 is formed, including the top of an optical black region 41, with an insulating film 38 therebetween, and further, color filters 44 and on-semiconductor-chip lenses 45 are formed on an effective pixel array 42 with a planarizing film 43 therebetween. On-semiconductor-chip lenses 45 can also be formed on the optical black region 41.

Figure 6:
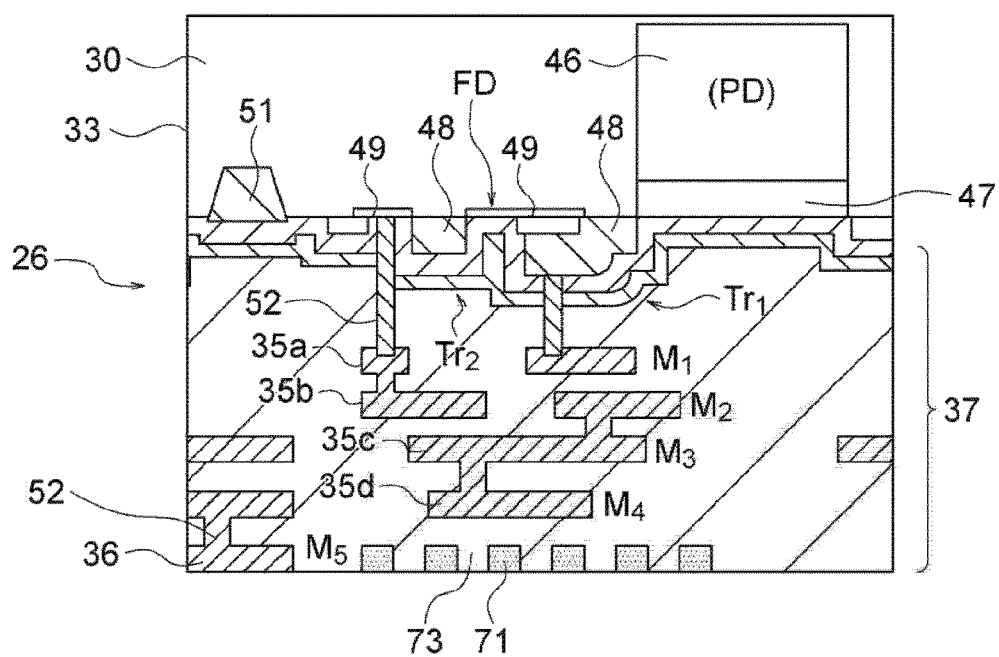
FIG. 6 is an enlarged configuration diagram showing a principal part of a first semiconductor chip part according to the first embodiment to which the present technology is applied.

In FIG. 1, the pixel transistors Tr1 and Tr2 are shown as representatives of the plurality of pixel transistors. FIG. 1 schematically shows the pixels of the pixel array 34. FIG. 6 shows details of one pixel. In the first semiconductor chip 26, the photodiodes PD are formed in the thinned first semiconductor substrate 33. Each photodiode PD is formed, for example, with an n-type semiconductor region 46 and a P-type semiconductor region 47 on the substrate front side. On a substrate surface constituting a pixel, P-type semiconductor regions 43 are formed with a gate insulating film therebetween. The pixel transistors Tr1 and Tr2 are each formed by a gate electrode 43 and a pair of source-drain regions 49. The pixel transistor Tr1 adjacent to the photodiode PD corresponds to a floating diffusion FD. Each unit pixel is isolated by an element isolation region 51. The element isolation region 51 is formed, for example, in a shallow trench isolation (STI) structure in which an insulating film such as a $SiO_2$ film is embedded in a trench formed in the substrate.

In the multilayer wiring layer 37 of the first semiconductor chip part 26, the pixel transistors and the corresponding wires 35, and the wires 35 in adjacent upper and lower layers are connected through conductive vias 52. Further, the connecting wire 36 including the fifth-layer metal M5 is formed, bordering the bonding plane 40 to the second semiconductor chip part 28 (see FIG. 1). The connecting wire 36 is connected to a required wire 35d including the fourth-layer metal M4 through conductive vias 52.

For the second semiconductor chip part 28 (see FIG. 1), a logic circuit 55 (see FIG. 1) constituting a peripheral circuit is formed in a region to be semiconductor chip parts of the second semiconductor substrate 54 including silicon. The logic circuit 55 is formed by a plurality of MOS transistors Tr11 to Tr14 including CMOS transistors, or, the front side of the second semiconductor substrate 54 shown in FIG. 7, a multilayer wiring layer 59 is formed in which wires 57 [57a to 57c] and the wire 58 (see FIG. 1) including a plurality of layers, in this example, four layers of metal M11 to M14 are arranged with an interlayer insulating film 56 therebetween. For the wires 57 and the wire 58, copper (Cu) wires made by a dual damascene process are used.

Figure 7:
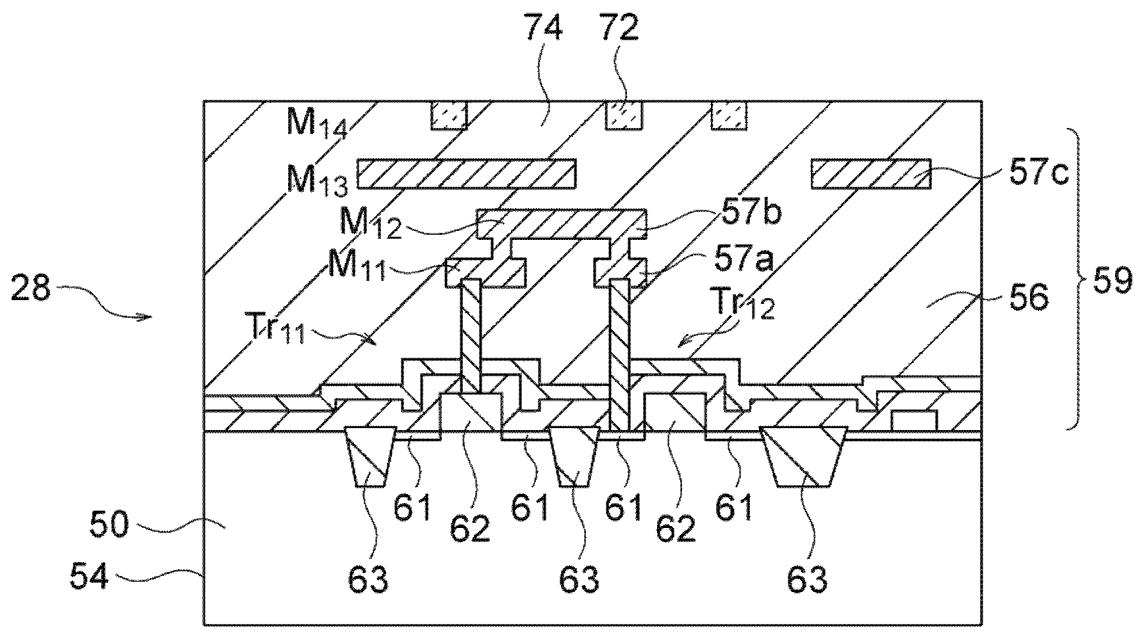
FIG. 7 is an enlarged configuration diagram showing a principal part of a second semiconductor chip part according to the first embodiment to which the present technology is applied.

In FIG. 1, the plurality of MOS transistors in the logic circuit 55 are represented by the MOS transistors Tr11 to Tr14. FIG. 1 schematically shows the MOS transistors Tr11 to Tr14. FIG. 7 shows details of the MOS transistors Tr11 and Tr12, for example. In the second semiconductor chip part 28, in a semiconductor well region on the front side of the second semiconductor substrate 54, the MOS transistors Tr11 and Tr12 are each formed with a pair of source-drain regions 61 and a gate electrode 62 with a gate insulating film therebetween. The MOS transistors Tr11 and Tr12 are isolated by element isolation regions 63 of an STI structure, for example.

In the multilayer wiring layer 59 of the second semiconductor chip part 28, the MOS transistors Tr11 to Tr14 (see FIG. 1) and the wires 57, and the wires 57 in the adjacent upper and lower layers are connected through conductive vias 64 (see FIG. 1). Further, the connecting wire 58 (see FIG. 1) including the fourth-layer metal M14 (see FIG. 7) is formed, bordering the bonding plane 40 to the first semiconductor chip part 26. The connecting wire 58 is connected to a required wire 57c including the third-layer metal M13 through conductive vias 64.

The first semiconductor chip part 26 and the second semiconductor chip part 28 are electrically connected by directly bonding the connecting wire 36 and the connecting wire 58 bordering the bonding plane 40 together, with the multilayer wiring layer 37 and the multilayer wiring layer 59 of them facing each other. An interlayer insulating film 66 in the vicinity of the junction is formed by a combination of a Cu diffusion barrier insulating film for preventing Cu diffusion from Cu wires and an insulating film having no Cu diffusion barrier properties, as shown in a manufacturing method described later. The direct bonding of the connecting wire 36 and the connecting wire 58 formed by Cu wires is performed by thermal diffusion bonding. The bonding of the interlayer insulating films 66 other than the connecting wire 36 and the connecting wire 58 is performed by plasma bonding.

As described above, other than the method of directly bonding the connecting wire 36 and the connecting wire 58 bordering the bonding plane 40, a method can be used in which an extremely thin uniform insulating thin film 900 is formed on the respective surfaces of the multilayer wiring layer 37 and the multilayer wiring layer 59 for bonding by plasma bonding. Note that the insulating thin film 900 is not shown in FIG. 1.

Figure 8:
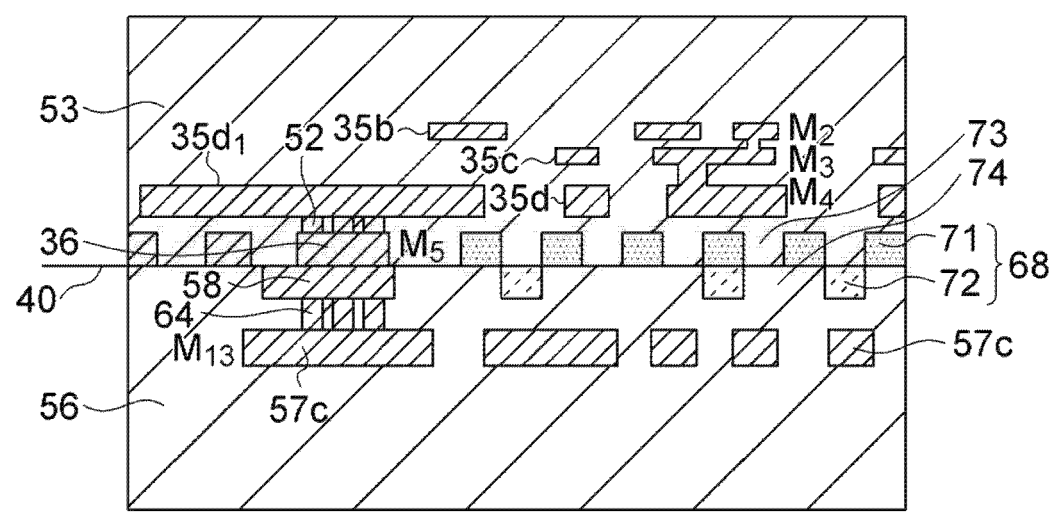
FIG. 8 is an enlarged configuration diagram showing a principal part of a bonded portion according to the first embodiment to which the present technology is applied.

Then, in the first embodiment, in particular, as shown in FIG. 1 and FIG. 8 (an enlarged view of a principal part), a light-shielding layer 68 including conductive films in the same layers as the connecting wire 36 and the connecting wire 58 is formed in the vicinity of the junction between the first semiconductor chip part 26 and the second semiconductor chip part 28. The light-shielding layer 68 of the first embodiment is formed by the first conductors 71 including the metal M5 in the same layer as the connecting wire 36 on the first semiconductor chip part 26 side, and the second conductors 72 including the metal M14 in the same layer as the connecting wire 58 on the second semiconductor chip part 28 side.

Example of Method of Manufacturing Solid-State Imaging Device

Figure 9:
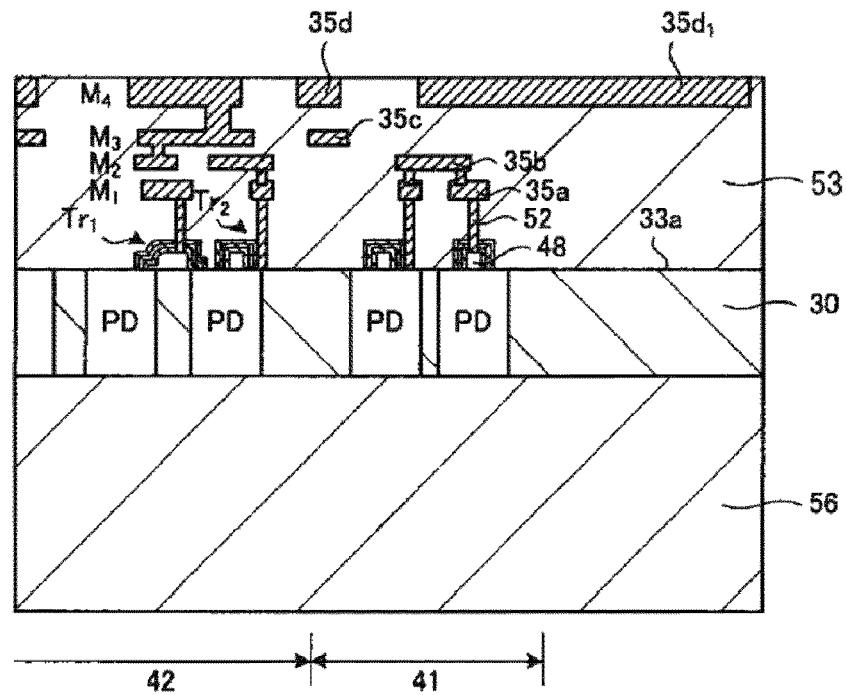
FIG. 9 is a manufacturing process diagram (1) showing an example of a method of manufacturing the solid-state imaging device according to the first embodiment to which the present technology is applied.
Figure 10:
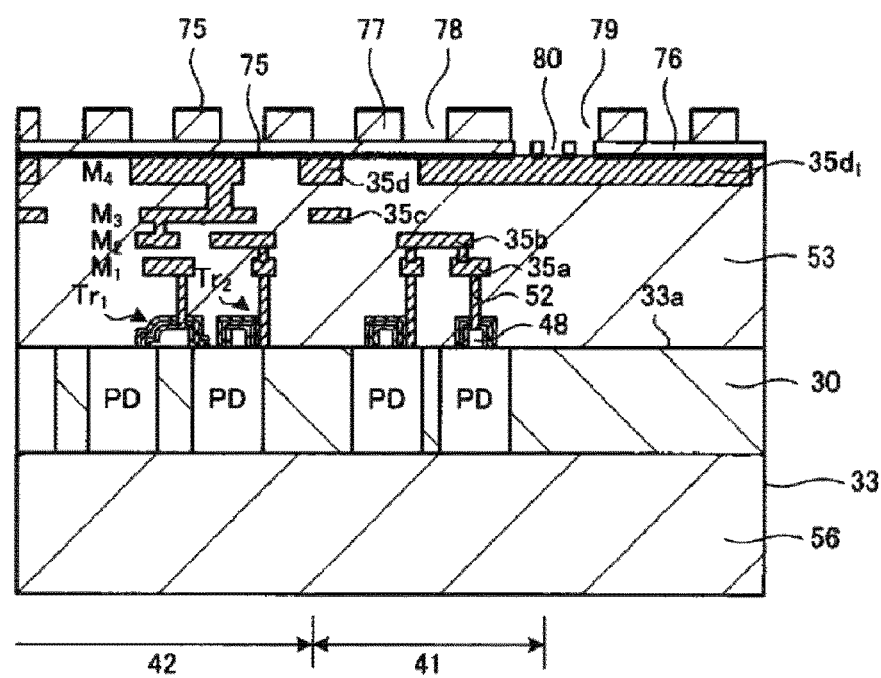
FIG. 10 is a manufacturing process diagram (2) showing the example of the method of manufacturing the solid-state imaging device according to the first embodiment to which the present technology is applied.
Figure 11:
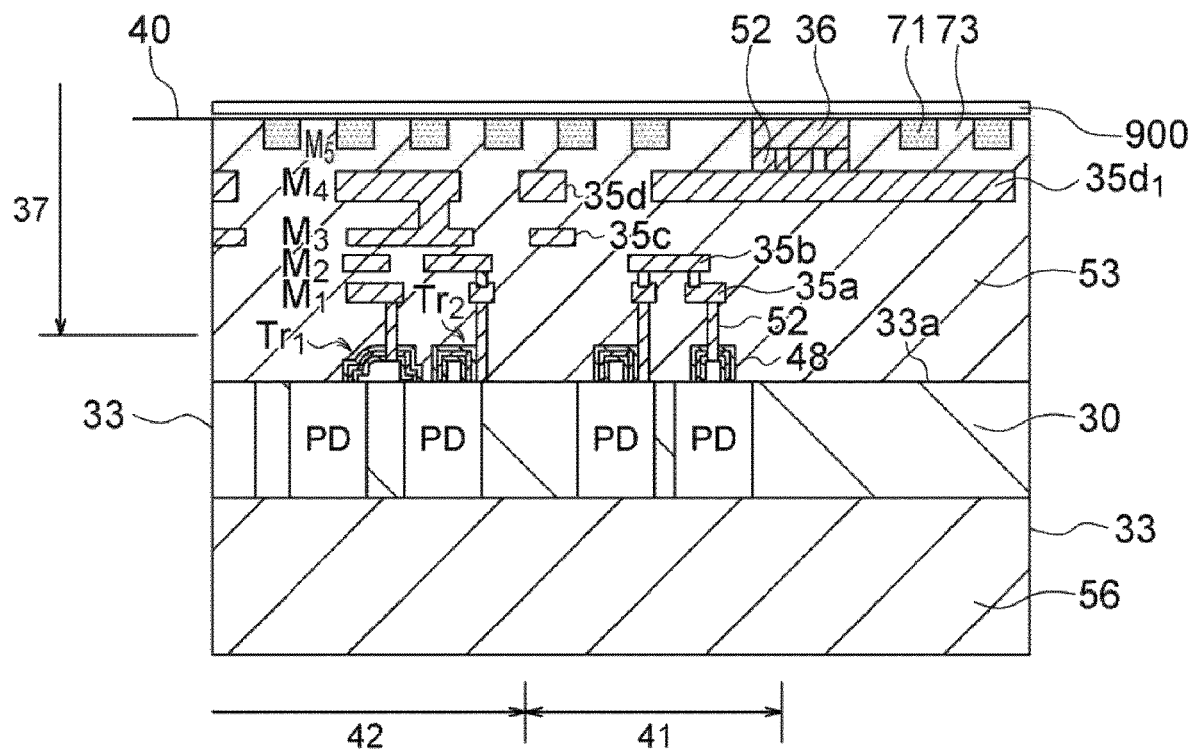
FIG. 11 is a manufacturing process diagram (3) showing the example of the method of manufacturing the solid-state imaging device according to the first embodiment to which the present technology is applied.
Figure 12:
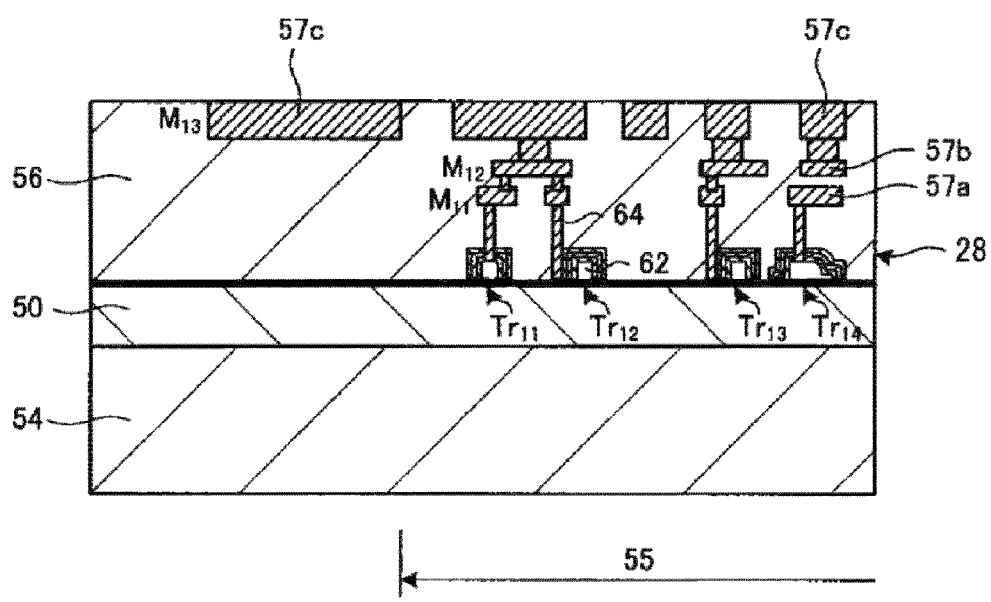
FIG. 12 is a manufacturing process diagram (4) showing the example of the method of manufacturing the solid-state imaging device according to the first embodiment to which the present technology is applied.
Figure 13:
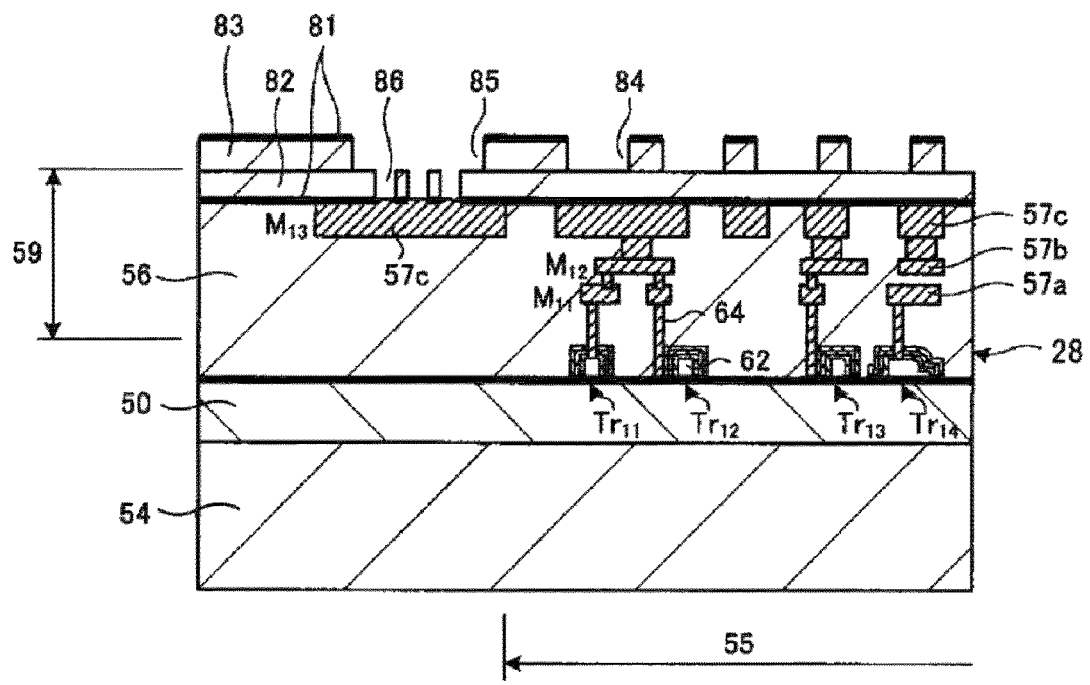
FIG. 13 is a manufacturing process diagram (5) showing the example of the method of manufacturing the solid-state imaging device according to the first embodiment to which the present technology is applied.
Figure 14:
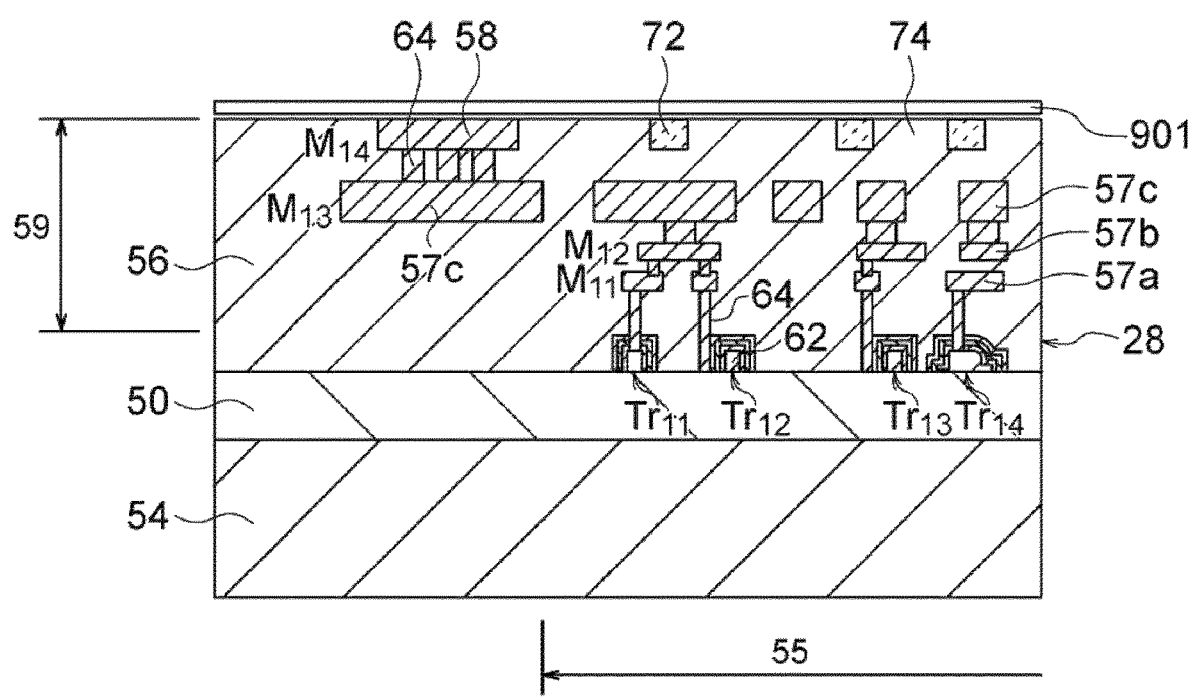
FIG. 14 is a manufacturing process diagram (6) showing the example of the method of manufacturing the solid-state imaging device according to the first embodiment to which the present technology is applied.

FIGS. 9 to 16 show an example of a method of manufacturing the solid-state imaging device 31 according to the first embodiment. FIGS. 9 to 11 show a process on the side of the first semiconductor chip part 26 including the pixel array. FIGS. 12 to 14 a process on the side of the second semiconductor chip part 28 including the logic circuit, and FIGS. 15 to 17 a process of and after bonding.

First, as shown in FIG. 9, the semiconductor well region 30 is formed in a region to be semiconductor chip parts of a first semiconductor wafer (that is, the first semiconductor substrate) 33 including, for example, silicon, and the photodiodes PD to serve as photoelectric converters of the pixels are formed in the semiconductor well region 30. Although not shown, the element isolation regions 51 (see FIG. 6) can be formed first. The photodiodes PD are formed by being extended in the depth direction of the semiconductor well region 30. The photodiodes PD are formed in the effective pixel array 42 and the optical black region 41 which constitute the pixel array 34.

Further, the plurality of pixel transistors constituting each pixel is formed on the front 33a side of the semiconductor well region 30. The pixel transistors can be composed, for example, of a transfer transistor, a reset transistor, an amplification transistor, and a selection transistor. Here, as described above, the pixel transistors Tr1 and Tr2 are representatively shown. Although not shown, each of the pixel transistors Tr1 and Tr2 is formed with a pair of source-drain regions and a gate electrode formed with a gate insulating film therebetween.

In a portion above the front 33a side of the semiconductor substrate 33, the wires 35 [35a, 35b, 35c, and 35d] including the plurality of layers, in this example, the four layers of metal M1 to M4 are formed, including the conductive vias 52, with the interlayer insulating film 53 therebetween. The wires 35 can be formed by a dual damascene process. Specifically, connection holes and wire grooves are simultaneously formed by via first in the interlayer insulating film 53, a Cu diffusion barrier metal film for preventing Cu diffusion and a Cu seed film are formed, and then a Cu material layer is embedded by a plating method. Examples of the Cu diffusion barrier metal film include films of Ta, TaN, Ti, TiN, W, WN, Ru, TiZrN, and alloys containing these. Then, a surplus Cu material layer is removed by a chemical mechanical polishing (CMP) method, so that planarized Cu wires integrated with conductive vias are formed. After that, although not shown, a Cu diffusion barrier insulating film is formed. As the Cu barrier insulating film, for example, an insulating film of SiN, Sic, SiCN, SiON or the like can be used. By repeating this process, the wires 35a to 35d including the four layers of metal M1 to M4 are formed.

Next, as shown in FIG. 10, a first insulating film 76 having no Cu diffusion barrier properties, a second insulating film 77 having no Cu diffusion barrier properties, and a Cu diffusion barrier insulating film 75 are sequentially formed. The first insulating film 76 and the second insulating film 77 are each formed by a $SiO_2$ film, a SiCOH film, or the like. Furthermore, as the Cu barrier insulating film 75, for example, an insulating film of SiN, Sic, SiCN, SiON or the like can be used, as described above. The Cu diffusion barrier insulating film 75, the first insulating film 76, and the second insulating film 77 correspond to the interlayer insulating film 53. Then, the Cu diffusion barrier insulating film 75 in the outermost surface, the second insulating film 77, and the first insulating film 76 are patterned by via first, using lithography and etching technologies, to selectively open via holes 80. After that, the second insulating film 77 portion is patterned to selectively form openings 78. That is, patterning is performed to provide the openings 78 in portions corresponding to the first conductors 71 to be formed (portions other than the first insulating films 73), an opening 79 in a portion corresponding to the connecting wire 36 to be formed, and the via holes 80.

Next, as shown in FIG. 11, the first conductors 71 having the first insulating films 73, and the conductive vias 52 and the connecting wire 36 connected to the wire 35d are formed by embedding a Cu material into the openings 78 and 79 and the via holes 80 using the dual damascene process as described above. The first conductors 71 and the connecting wire 36 are formed by the fifth-layer metal M5. As a result, the wires 35a to 35d including the metal M1 to M5, the connecting wire 36, the first conductors 71, the interlayer insulating film 53, and the insulating films 75 to 77 form the multilayer wiring layer 37. Here, a wire 35d1 including the fourth-layer metal M4 connected to the connecting wire 36 is preferably formed in an area sufficiently extended to the first conductor 71 side to overlap the first conductor 71, so as to prevent light emitted from the logic circuit side from leaking to the photodiode PD side. Note that first conductors forming the first conductors 71 are arranged evenly in a striped pattern, for example.

Furthermore, the extremely thin uniform insulating thin film 900 is formed on the tops of the first conductors 71 and the connecting wire 36.

On the other hand, as shown in FIG. 12, a semiconductor well region 50 is formed in a region to be semiconductor chip parts of a second semiconductor wafer (which hereinafter refers to the second semiconductor substrate) 54 including, for example, silicon. In the semiconductor well region 50, the plurality of MOS transistors Tr11 to Tr14 constituting the logic circuit 55 is formed. Here, as described above, the MOS transistors Tr11 to Tr14 are representatively shown. Although not shown, the element isolation regions 63 (see FIG. 7) can be formed first.

In a portion above the front side of the semiconductor substrate 54, the wires 57 [57a, 57b, and 57c] including the plurality of layers, in this example, the three layers of metal M11 to M13 are formed, including the conductive vias 64, with the interlayer insulating film 56 therebetween. The wires 57 can be formed by a dual damascene process. Specifically, connection holes and wire grooves are simultaneously formed by via first in the interlayer insulating film, a Cu diffusion barrier metal film for preventing Cu diffusion and a Cu seed film are formed, and then a Cu material layer is embedded by a plating method. Examples of the Cu diffusion barrier metal film include films of Ta, TaN, Ti, TiN, W, WN, Ru, TiZrN, and alloys containing these. Then, a surplus Cu material layer is removed by a chemical mechanical polishing (CMP) method, so that planarized Cu wires integrated with conductive vias are formed. After that, although not shown, a Cu diffusion barrier insulating film is formed. As the Cu barrier insulating film, for example, an insulating film of SiN, SiC, SiCN, SiON or the like can be used. By repeating this process, the wires 57a to 57c including the three layers of metal M11 to M13 are formed.

Next, as shown in FIG. 13, a first insulating film 82 having no Cu diffusion barrier properties, a second insulating film 83 having no Cu diffusion barrier properties, and a Cu diffusion barrier insulating film 81 are sequentially formed. The first insulating film 82 and the second insulating film 83 are formed by a $SiO_2$ film, a SiCOH film, or the like. Furthermore, as the Cu barrier insulating film 81, for example, an insulating film of SiN, SiC, SiCN, SiON or the like can be used as described above. The Cu diffusion barrier insulating film 81, the first insulating film 82, and the second insulating film 83 correspond to the interlayer insulating film. Then, the Cu diffusion barrier insulating film 81 in the outermost surface, the second insulating film 83, and the first insulating film 82 are patterned by via first, using lithography and etching technologies, to selectively open via holes 86. After that, the second insulating film 83 is patterned to selectively form openings 84 and 85. The openings 84 are formed in positions to cover the first insulating films 73 of the first conductors 71 on the first semiconductor chip 26 side. The openings 84 are desirably formed in a size to cover the first insulating films 73 of the first conductors 71 and overlap the first conductors 71 so as to prevent light leakage due a bonding misalignment when the first semiconductor substrate 33 and the second semiconductor substrate 54 are bonded together later. That is, patterning is performed to provide the openings 84 in portions corresponding to the second conductors 72 to be formed, the opening 85 in a portion corresponding to the connecting wire 58 to be formed, and the via holes 86.

Next, as shown in FIG. 14, the second conductors 72 and the conductive vias 64 and the connecting wire 58 connected to the wire 57c are formed by embedding a Cu material into the openings 84 and 35 and the via holes 86 using the dual damascene process as described above. The second conductors 72 and the connecting wire 58 are formed by the fourth-layer metal M14. As a result, the wires 57a to 57c including the metal M11 to M13, the connecting wire 58, the second conductors 72, the interlayer insulating film 56, and the insulating films 81 to 83 form the multilayer wiring layer 59.

Further, an extremely thin uniform insulating thin film 901 is formed on the tops of the second conductors 72 and the connecting wire 59.

Figure 15:
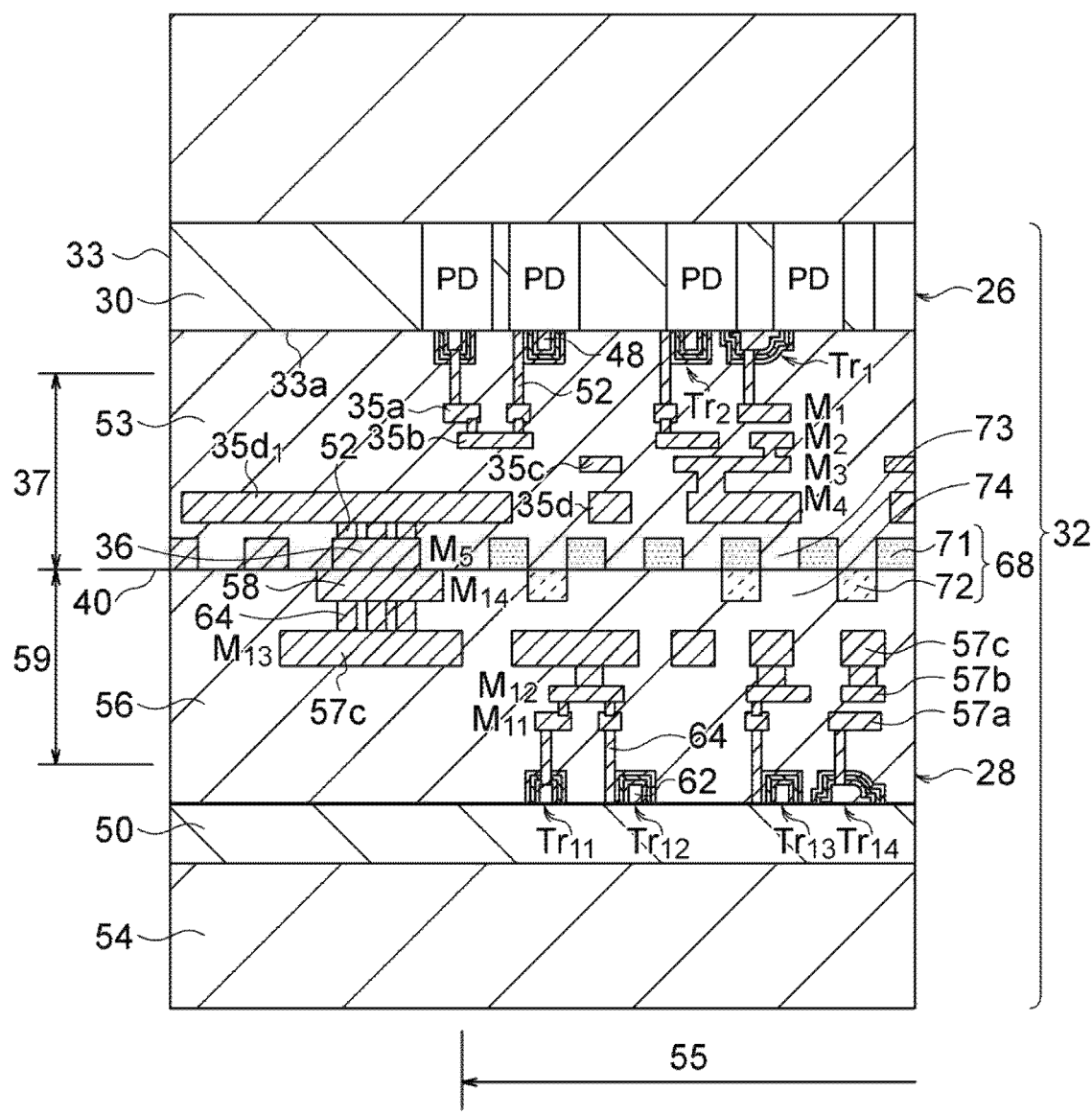
FIG. 15 is a manufacturing process diagram (7) shewing the example of the method of manufacturing the solid-state imaging device according to the first embodiment to which the present technology is applied.

Next, as shown in FIG. 15, the first semiconductor substrate 33 and the second semiconductor substrate 54 are bonded together such that the first semiconductor substrate 33 and the second semiconductor substrate 54 are electrically connected with their respective multilayer wiring layers facing each other and with the connecting wires 36 and 58 on both sides in direct contact with each other. That is, the first semiconductor substrate 33 and the second semiconductor substrate 54 are physically bonded together and electrically connected. At this time, the first conductors 71 and the second conductors 72 are also directly bonded together at overlapping portions. Specifically, by heat treatment, the connecting wire 36 and the connecting wire 58, and the first conductors 71 and the second conductors 72 are thermal-diffusion-bonded to each other. The heat treatment temperature at this time may be about 100° C. to 500° C. Further, the insulating films (the first insulating films 73 and the second insulating films 74) constituting the interlayer insulating film 66 are surface-treated and plasma-bonded.

As described above, first, the insulating films are sandwiched in the bonding plane 40 between the first conductors 71 and the second conductors 72, which are then heated to grow crystals of copper serving as the conductors and joined, and thus are electrically connected in the vicinity of the bonding plane 40. Consequently, the first conductors 71 and the second conductors 72 are arranged closer to the bonding plane 40 than the logic circuit 55 and the wires 35 formed in the first semiconductor chip 26 and the second semiconductor chip, respectively.

Furthermore, they are arranged such that the proportion of the areas where the first insulating films 73 formed in the first semiconductor substrate 33 and the second insulating films 74 formed in the second semiconductor substrate 54 are bonded together to the bonding area between the first semiconductor substrate 33 and the second semiconductor substrate 54 is constant before and after the first semiconductor substrate 33 and the second semiconductor substrate 54 are bonded together.

Figure 16:
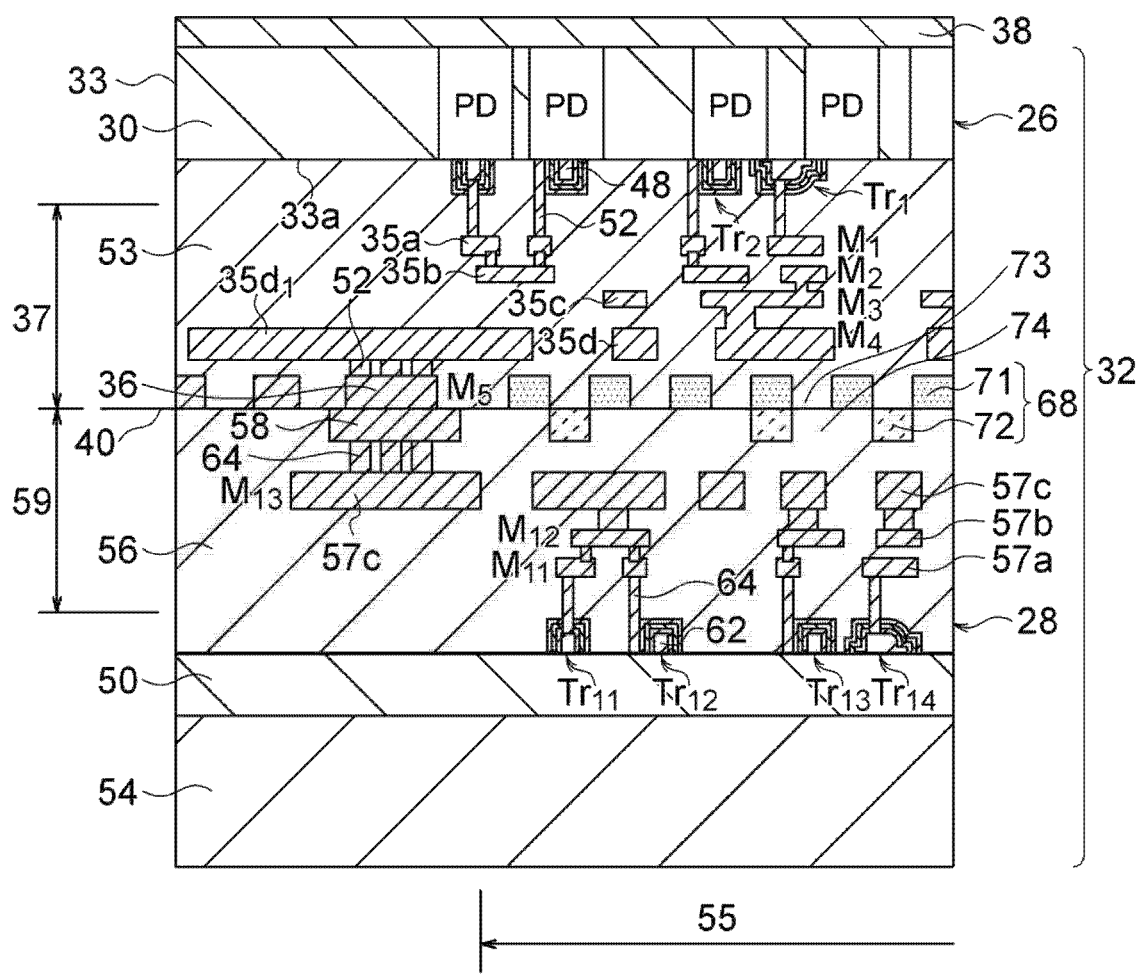
FIG. 16 is a manufacturing process diagram (8) showing the example of the method of manufacturing the solid-state imaging device according to the first embodiment to which the present technology is applied.

Next, as shown in FIG. 16, the first semiconductor substrate 33 is thinned by grinding and polishing using a CMP method or the like from the back side, leaving a film thickness necessary for the photodiodes PD.

Figure 17:
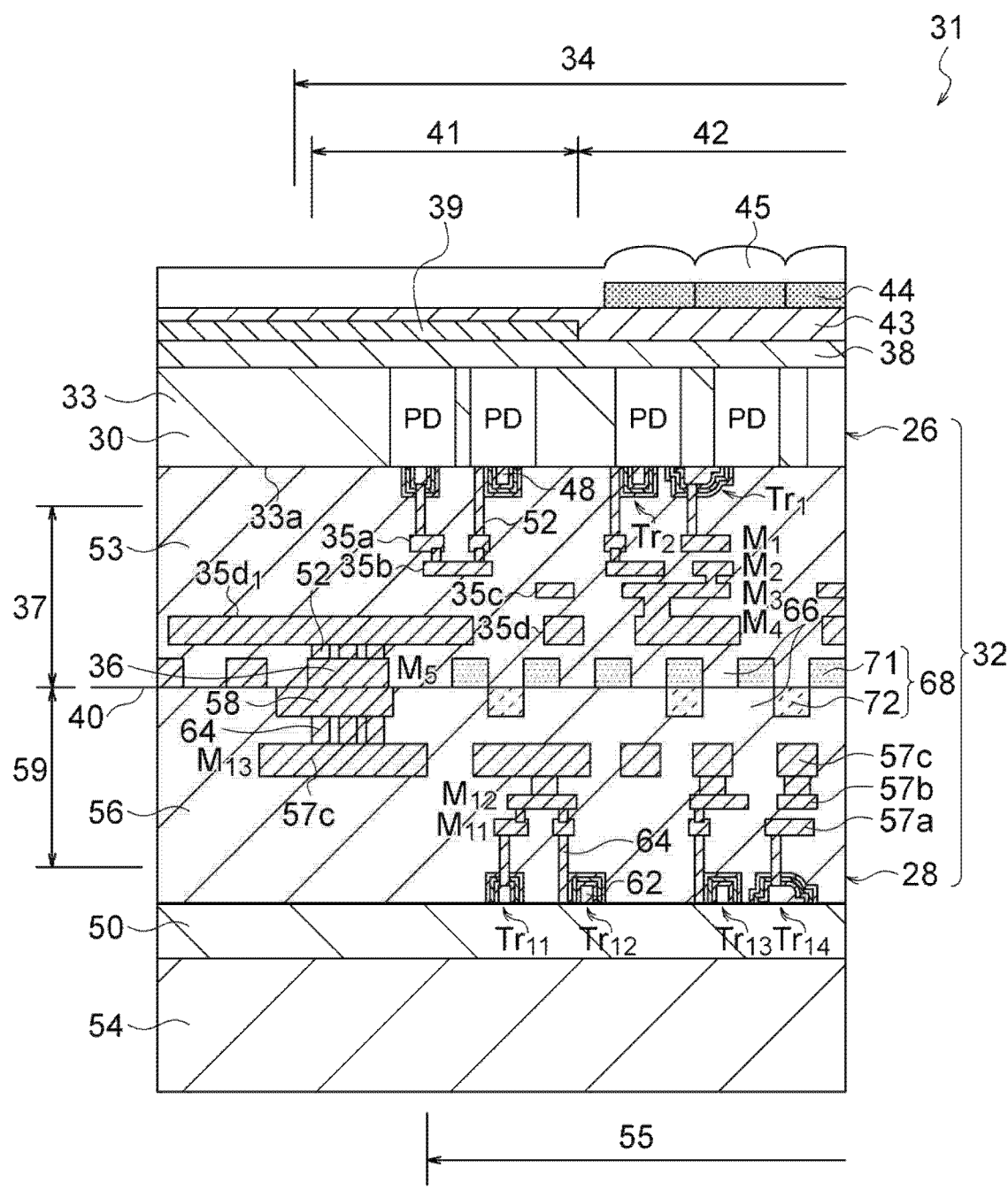
FIG. 17 is a manufacturing process diagram (9) showing the example of the method of manufacturing the solid-state imaging device according to the first embodiment to which the present technology is applied.

Next, as shown in FIG. 17, the light-shielding film 39 is formed on the thinned surface with the insulating film 38 therebetween, including the tops of the photodiodes PD corresponding to the optical black region. Further, the color filters 44 and the on-semiconductor-chip lenses 45 are formed on the photodiodes PD corresponding to the effective pixel array with the planarizing film 43 therebetween.

Then, semiconductor chip formation is performed in which the first semiconductor substrate 33 and the second semiconductor substrate 54 bonded together are separated into semiconductor chips, to obtain the solid-state imaging device 31 as the object shown in FIG. 1.

As the first conductors 71 and the second conductors 72, the connecting wire 36 and the connecting wire 58, and the metal M5 and M14 constituting the wires in the same layer as these, a material that has high conductivity and high light-shielding properties and is easy to bond is desirable. As a material having such properties, other than Cu, a single material such as Al, W, Ti, Ta, Mo, or Ru, or an alloy can be used.

The film thickness of the light-shielding layer 68, in the first embodiment of the present technology, the film thickness of the first conductors 71 and the second conductors 72 is desirably determined according to the wavelength of light on the side of the second semiconductor chip part 28 that emits light. In the first embodiment of the present technology, it is necessary to shield light emitted from hot carriers of the MOS transistors in the second semiconductor chip part 28, and thus the light-shielding-layer thickness needs to be designed against light having a wavelength of about 1 μm. For example, the film thickness of the light-shielding layer 68, that is, the film thickness of the first conductors 71 and the second conductors 72 can be set to about 50 nm to 800 nm.

According to the solid-state imaging device 31 and the manufacturing method thereof of the first embodiment, in the vicinity of the bonding plane 40 between the first semiconductor chip part 26 and the second semiconductor chip part 28, regions where the first conductors and the second conductors overlap, regions where the first insulating films formed at the first conductors and the second conductors overlap, regions where the second insulating films formed at the second conductors and the first conductors overlap, and regions where the first insulating films and the second insulating films overlap are formed. Furthermore, they are arranged such that the proportion of areas where the first insulating films 73 in the first semiconductor substrate 33 and the second insulating films 74 in the second semiconductor substrate 54 are bonded together to the bonding area between the first semiconductor substrate 33 and the second semiconductor substrate 54 is constant before and after the first semiconductor chip 26 and the second semiconductor chip 28 are bonded together.

Consequently, according to the solid-state imaging device 31 and the manufacturing method thereof, even if a bonding misalignment occurs when the first semiconductor chip part 26 and the second semiconductor chip part 28 are bonded together, variation in bonding strength can be prevented in the bonding plane 40 between the first semiconductor substrate 33 and the second semiconductor substrate 54. This allows prevention of generation of voids in the bonding plane 40 even after production is started. Further, the prevention of occurrence of voids in the bonding plane 40 allows the provision of the solid-state imaging device 31 that improves image quality.

Furthermore, according to the solid-state imaging device 31 and the manufacturing method thereof of the first embodiment, the light-shielding layer 68 including the metal M5 and M14 in the same layers as the connecting wire 36 and the connecting wire 58 is formed in the vicinity of the junction between the first semiconductor chip part 26 and the second semiconductor chip part 28. The light-shielding layer 68 can prevent light emitted by hot carriers from the MOS transistors in the logic circuit 55 in the second semiconductor chip part 28 from entering the pixel array on the first semiconductor chip part 26 side. Consequently, the adverse effects of light emission by the hot carriers are restrained, and thus dark current and random noise can be reduced.

Furthermore, according to the method of manufacturing the solid-state imaging device 31 of the first embodiment, the light-shielding layer 68 includes the metal M5 and M14 in the same layers as the connecting wire 36 and the connecting wire 58. Therefore, compared with conceivable technologies of solid-state imaging devices, the thickness of the entire bonded semiconductor chip can be reduced, and the solid-state imaging device 31 can be made thinner. Accordingly, it is possible to provide the solid-state imaging device 31 with smaller dark current and less random noise without increasing the thickness of the entire semiconductor chip.

In addition, in the solid-state imaging device 31 and the manufacturing method thereof according to the first embodiment, the light-shielding layer 68 is preferably, for example, energized with a ground potential to be fixed in potential and stabilized in potential. The potential fixing may be performed on the first semiconductor substrate 33 side, or may be performed on the second semiconductor substrate 54 side, or may be performed on both substrates of the first semiconductor substrate 33 and the second semiconductor substrate 54. This allows the light-shielding layer 68 to have a role of a shielding layer against electrical noise in the vicinity of the bonding plane 40 between the first semiconductor substrate 33 and the second semiconductor substrate 54. Thus, the light-shielding layer 68 can reduce defects in image quality due to the influence of the capacitive coupling between the first semiconductor substrate 33 and the second semiconductor substrate 54.

Moreover, according to the method of manufacturing the solid-state imaging device 31 of the first embodiment of the present technology, wires, a connecting wire, and a light-shielding layer can be formed at the same time, so that a reduction in the number of manufacturing steps, a reduction in a masking step, and a reduction in material cost can be made, allowing the manufacturing of a solid-state imaging device with smaller dark current and less random noise at low cost.

Figure 18:
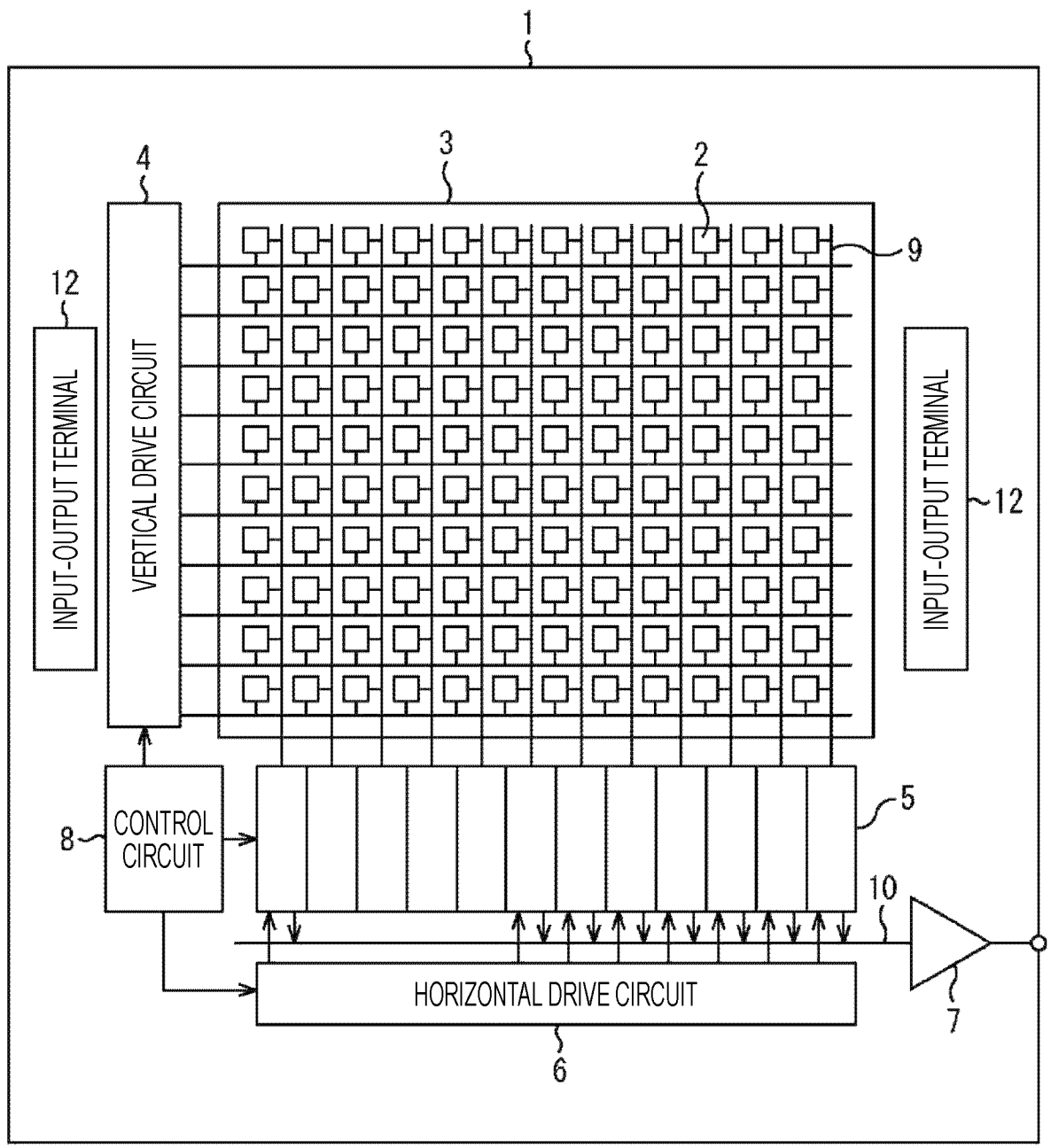
FIG. 18 is a block diagram showing an example of the overall configuration of the solid-state imaging device according to the first embodiment to which the present technology is applied.

FIG. 18 is a block diagram showing an example of the overall configuration of a solid-state imaging device according to the first embodiment of the present technology.

As shown in FIG. 18, a solid-state imaging device 1 is configured, for example, as a complementary metal-oxide semiconductor (CMOS) image sensor. The solid-state imaging device 1 includes a pixel region (pixel array) 3 in which a plurality of pixels 2 is regularly arranged in a two-dimensional array, and peripheral circuitry on a semiconductor substrate (for example, a Si substrate) (not shown).

Each pixel 2 has a photoelectric converter (for example, a photodiode) and a plurality of pixel transistors (MOS transistors). The plurality of pixel transistors can be composed, for example, of three transistors, a transfer transistor, a reset transistor, and an amplification transistor. Further, the plurality of pixel transistors can include four transistors with the addition of a selection transistor. Note that an equivalent circuit of a unit pixel is similar to that of known technology, and thus detailed description thereof will be omitted.

Furthermore, each pixel 2 may be configured as one unit pixel, or may have a sharing pixel structure. The pixel sharing structure is a structure in which a plurality of photodiodes shares a floating diffusion and transistors other than a plurality of transfer transistors. That is, in sharing pixels, photodiodes and transfer transistors constituting a plurality of unit pixels share each of the other pixel transistors.

The peripheral circuitry includes a vertical drive circuit 4, column signal processing circuits 5, a horizontal drive circuit 6, an output circuit 7, and a control circuit 8.

The vertical drive circuit 4 is formed, for example, by a shift register. The vertical drive circuit 4 selects a pixel drive wire, provides a pulse for driving pixels to the selected pixel drive wire, and drives pixels row by row. That is, the vertical drive circuit 4 selectively scans the pixels 2 in the pixel array 3 row by row sequentially in the vertical direction. Then, the vertical drive circuit 4 provides pixel signals based on signal charges generated in the photoelectric converters of the pixels 2 according to the amount of received light through vertical signal lines 9 to the column signal processing circuits 5.

The column signal processing circuits 5 are arranged for individual columns of the pixels 2, for example. The column signal processing circuits 5 perform signal processing such as noise removal on signals output from the pixels 2 in one row on an individual pixel column basis. Specifically, the column signal processing circuits 5 perform signal processing such as correlated double sampling (CDS) for removing fixed pattern noise peculiar to the pixels 2, signal amplification, and analog-digital (A/D) conversion. In an output stage of each column signal processing circuit 5, a horizontal selection switch (not shown) connected to a horizontal signal line 10 is provided.

The horizontal drive circuit 6 is formed, for example, by a shift register. The horizontal drive circuit 6 selects each of the column signal processing circuits 5 in order by successively outputting a horizontal scanning pulse, and causes a pixel signal from each of the column signal processing circuits 5 to be output to the horizontal signal line 10.

The output circuit 7 performs signal processing on a signal successively provided from each of the column signal processing circuits 5 through the horizontal signal line 10, for output. For example, the output circuit 7 may perform only buffering, or may perform black level adjustment, column variation correction, various types of digital signal processing, etc.

The control circuit 8 receives an input clock and data instructing an operation mode etc., and outputs data such as internal information of the solid-state imaging device 1. Furthermore, on the basis of a vertical synchronization signal, a horizontal synchronization signal, and a master clock, the control circuit 8 generates a clock signal and control signals on the basis of which the vertical drive circuit 4, the column signal processing circuits 5, the horizontal drive circuit 6, and others operate. Then, the control circuit 8 inputs these signals to the vertical drive circuit 4, the column signal processing circuits 5, the horizontal drive circuit 6, and others.

An input-output terminal 12 constitutes a terminal that inputs an input clock and a signal for setting an operation mode to the control circuit 8. Furthermore, the input-output terminal 12 constitutes a terminal that outputs signals that have been subjected to signal processing in the output circuit 7 to the outside.

Figure 19:
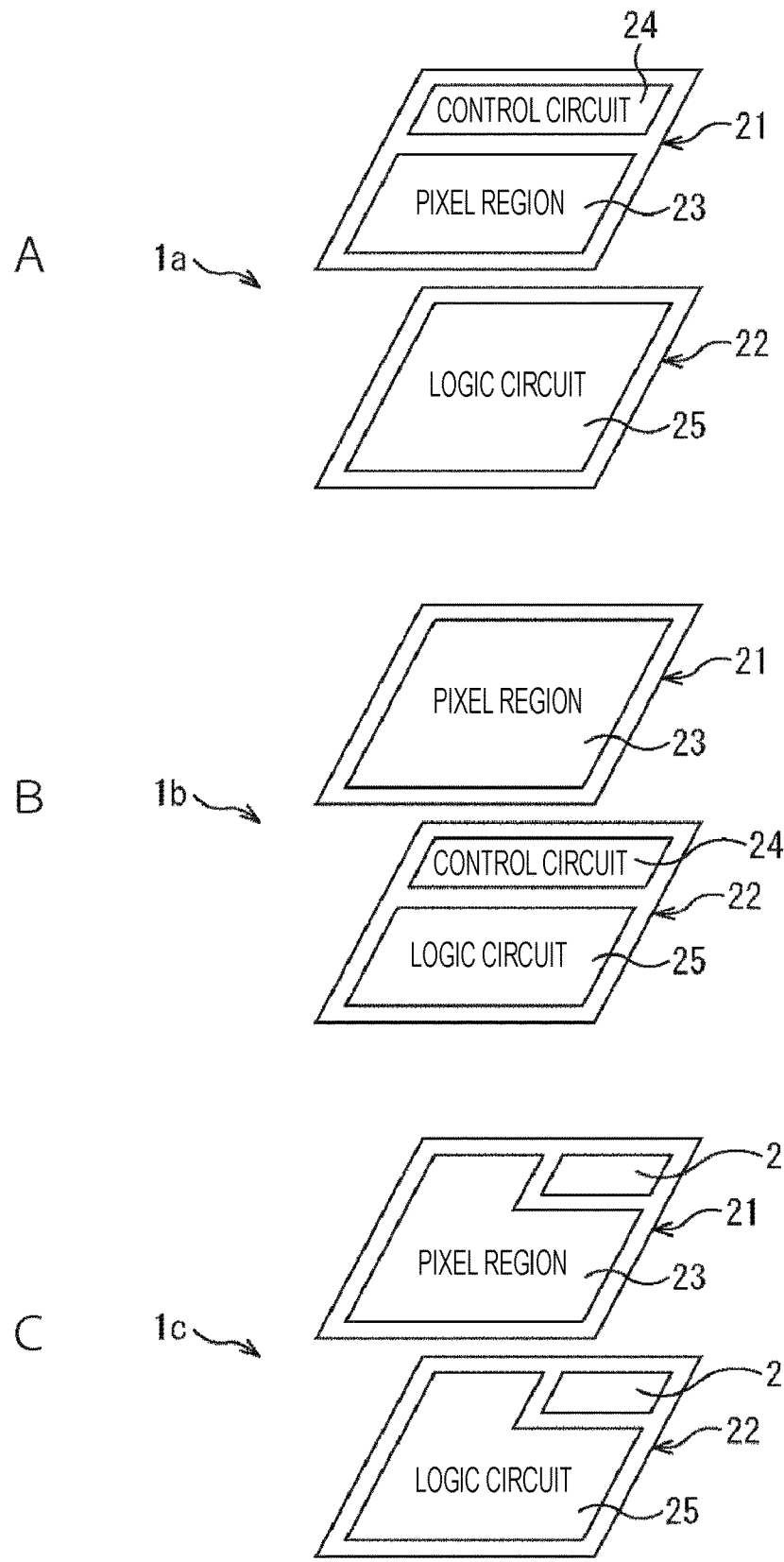
FIG. 19 is a schematic diagram showing the laminated structure of a solid-state imaging device according to the present technology.

FIGS. 19A to 19C are schematic diagrams showing examples of the laminated structure of a solid-state imaging device according to the present technology. Examples of the laminated structure of the solid-state imaging device to which the present technology is applied will be described with reference to FIGS. 19A to 19C.

As a first example, a solid-state imaging device 1a shown in FIG. 19A includes a first semiconductor substrate 21 and a second semiconductor substrate 22. A pixel array 23 and a control circuit 24 are mounted on the first semiconductor substrate 21. A logic circuit 25 including a signal processing circuit is mounted on the second semiconductor substrate 22. Then, the first semiconductor substrate 21 and the second semiconductor substrate 22 are electrically connected to each other, constituting the solid-state imaging device 1a as a single semiconductor chip.

As a second example, a solid-state imaging device 1b shown in FIG. 19B includes a first semiconductor substrate 21 and a second semiconductor substrate 22. A pixel array 23 is mounted on the first semiconductor substrate 21. A control circuit 24 and a logic circuit 25 including a signal processing circuit are mounted on the second semiconductor substrate 22. Then, the first semiconductor substrate 21 and the second semiconductor substrate 22 are electrically connected to each other, constituting the solid-state imaging device 1b as a single semiconductor chip.

As a third example, a solid-state imaging device 1c shown in FIG. 19C includes a first semiconductor substrate 21 and a second semiconductor substrate 22. A pixel array 23 and a control circuit 24-1 that controls the pixel array 23 are mounted on the first semiconductor substrate 21. A control circuit 24-2 that controls a logic circuit 25 and the logic circuit 25 including a signal processing circuit are mounted on the second semiconductor substrate 22. Then, the first semiconductor substrate 21 and the second semiconductor substrate 22 are electrically connected to each other, constituting the solid-state imaging device 1c as a single semiconductor chip.

Although not shown, depending on the configuration of a CMOS solid-state imaging device, two or more semiconductor chip parts may be bonded together to constitute it. For example, in addition to the above-mentioned first and second semiconductor chip parts, a semiconductor chip part including a memory element array, a semiconductor chip part including other circuit elements, or the like may be added, and three or more semiconductor chip parts may be bonded together to constitute a CMOS solid-state imaging device in a single chip.

3. Solid-State Imaging Device in Second Embodiment

Figure 20:
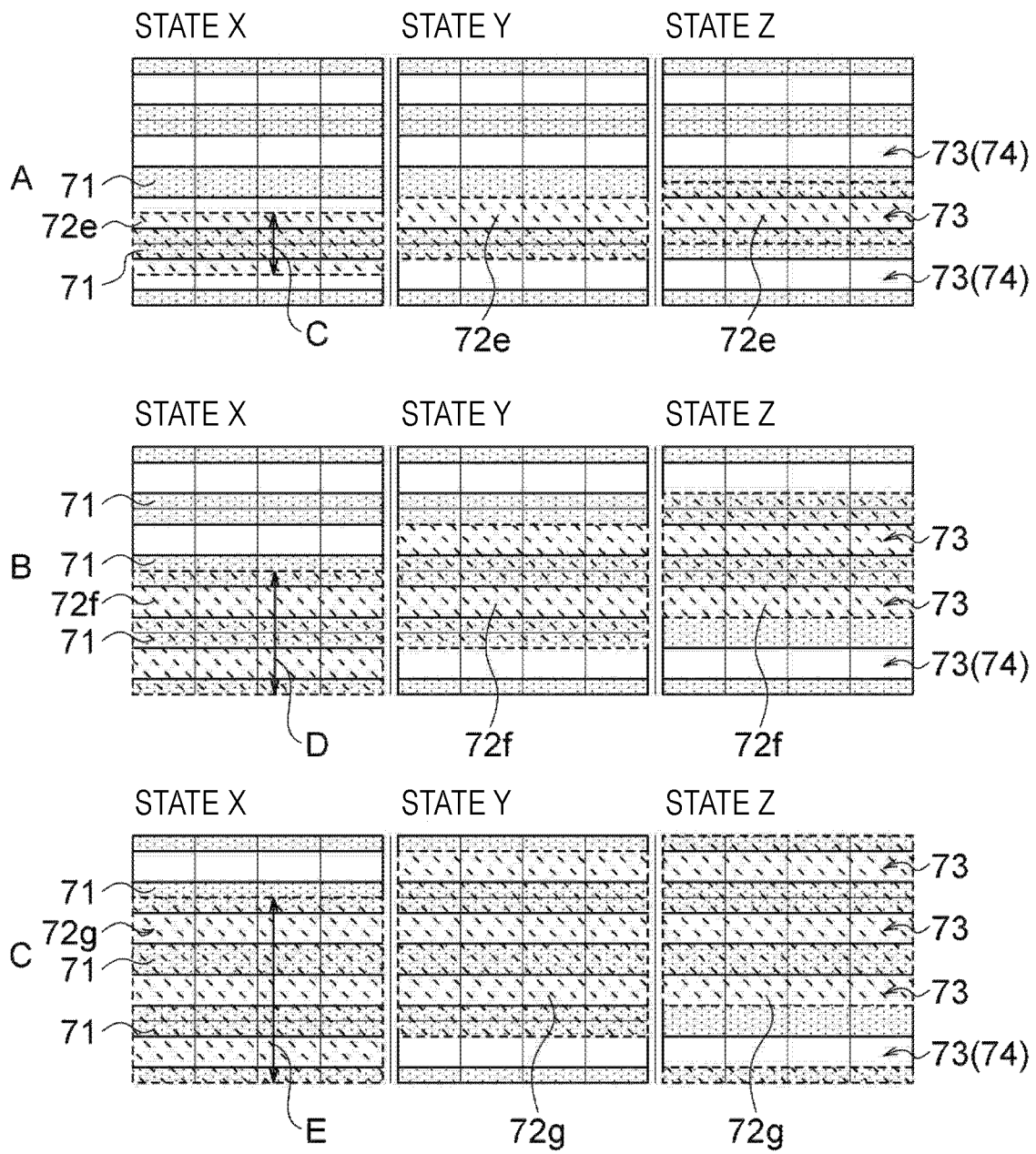
FIG. 20 is an explanatory diagram showing an example in a case where the width of a light-shielding portion on one side is a width that is an integral multiple of a repeating unit of light-shielding portions on the other side in a solid-state imaging device according to a second embodiment to which the present technology is applied.

With reference to FIGS. 20A to 20C, a second embodiment of a solid-state imaging device according to the present technology will be described. The solid-state imaging device of the second embodiment is different from the solid-state imaging device of the first embodiment shown in FIGS. 2A and 2B in that a second conductor 72e is arranged with a width that is an integral multiple of a repeating unit in which first conductors 71 are repeatedly arranged. Note that the other components are the same as those of the first embodiment, and thus will not be described.

For example, as shown in FIG. 20A, the width C of the second conductor 72e has a width equal to the repeating unit (pitch) of the first conductors 71. Furthermore, FIG. 20A shows varying states (a state X, a state Y, and a state Z) in which a bonding misalignment occurs in a bonding plane 40 between a first semiconductor substrate 33 and a second semiconductor substrate 54. FIG. 20A shows that in the second embodiment of the present technology, even if a bonding misalignment occurs between the first semiconductor substrate 33 and the second semiconductor substrate 54, the proportion of bonding areas between first insulating films 73 and second insulating films 74 to the bonding area between the first semiconductor substrate 33 and the second semiconductor substrate 54 does not change.

Furthermore, in FIG. 20B, a second conductor 72f is arranged with a width D that is twice the repeating unit (pitch) of the first conductors 71. Furthermore, in FIG. 20C, a second conductor 72g is arranged with a width E that is three times the repeating unit of the first conductors 71. Thus, FIGS. 20A to 20C show that if the width of the second conductors 72 is an integral multiple of the repeating unit of the first conductors 71, the proportion of bonding areas between the first insulating films 73 and the second insulating films 74 to the bonding area between the first semiconductor substrate 33 and the second semiconductor substrate 54 does not change.

Figure 21:
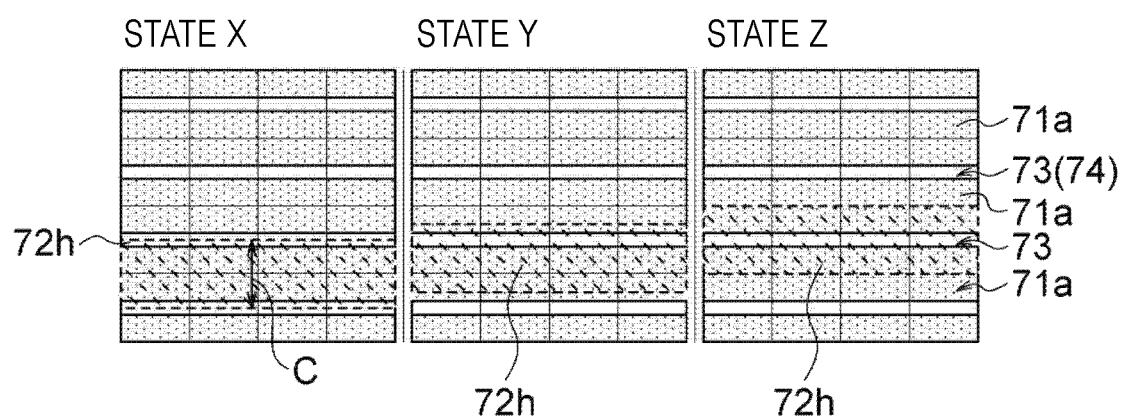
FIG. 21 is an explanatory diagram showing an example in a case where the metallic proportion of the light-shielding portions is changed in the solid-state imaging device according to the second embodiment to which the present technology is applied.

Furthermore, in FIGS. 20A to 20C, the metallic density of the first conductors 71 in the first semiconductor substrate 33 is 50%, but the second embodiment is not limited to this. FIG. 21 shows an embodiment in which the metallic density of the first conductors 71 in the first semiconductor substrate 33 is 75% for description.

In FIG. 21, the metallic density of first conductors 71a is 75%, and a second conductor 72h is arranged with a width C that is the repeating unit (pitch) of the first conductors 71a. In this case, it is shown that even in a varying state (a state X, a state Y, or a state Z) where a bonding misalignment has occurred between the first semiconductor substrate 33 and the second semiconductor substrate 54, if the width C of the second conductors 72h is the repeating unit (pitch) of the first conductors 71a, the proportion of bonding areas between the first insulating films 73 and the second insulating films 74 to the bonding area between the first semiconductor substrate 33 and the second semiconductor substrate 54 does not change.

Note that the second embodiment has the same configuration as the first embodiment except for the above-described point of difference from the first embodiment. The second embodiment, which has the same configuration as the first embodiment, thus has functions and effects similar to those of the first embodiment. Furthermore, third to sixth embodiments described below also have the same configuration as the first embodiment, and thus have functions and effects similar to those of the first embodiment.

4. Solid-State Imaging Device in Third Embodiment

Figure 22:
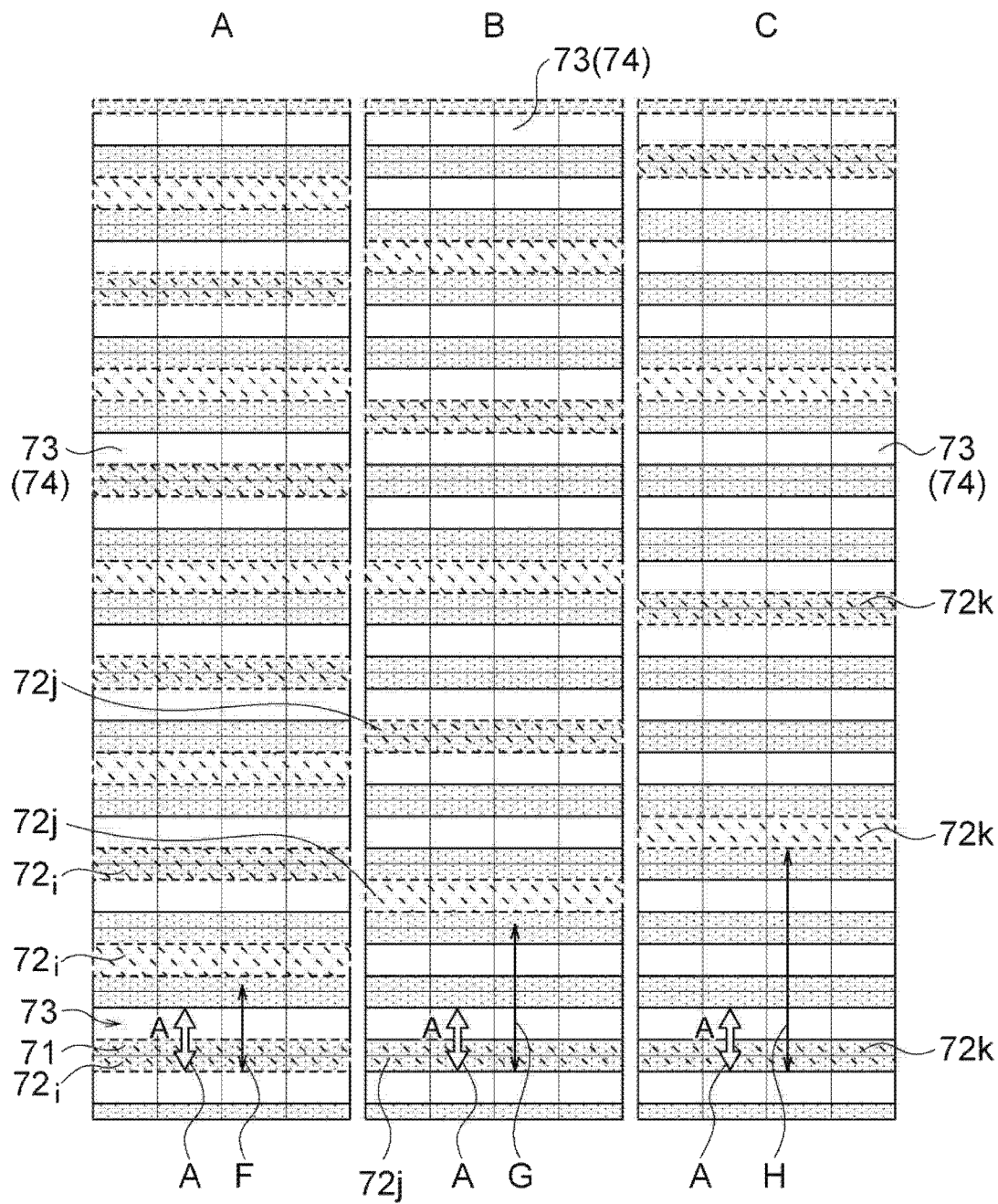
FIG. 22 is an explanatory diagram showing a layout in which light-shielding portions on one side are arranged such that their pitch is (an integer+½) times a repeating unit in which light-shielding portions on the other side are repeatedly arranged in a solid-state imaging device according to a third embodiment to which the present technology is applied.

With reference to FIGS. 22A to 22C, a third embodiment of a solid-state imaging device according to the present technology will be described. The solid-state imaging device of the third embodiment is different from the solid-state imaging device of the first embodiment in that second conductors 72 are arranged with a pitch that is (an integer+½) times a repeating unit in which first conductors 71 are repeatedly arranged. In the third embodiment described below, although the pitch of the second conductors 72 is (an integer+½) of the pitch of the first conductors 71, the proportion of bonding areas between first insulating films 73 and second insulating films 74 to the bonding area between a first semiconductor substrate 33 and a second semiconductor substrate 54 does not change.

As shown in FIG. 22A, second conductors 72i are laid out with a pitch that is one-and-a-half times the pitch (repeating unit) of the first conductors 71. If the pitch (repeating unit) of the first conductors 71 is a distance A, the second conductors 72i are arranged with a pitch (repeating unit) of a distance F that is one-and-a-half times the distance A.

Furthermore, as shown in FIG. 22B, second conductors 72j are arranged with a pitch of a distance G that is two-and-a-half times the distance A of the pitch of the first conductors 71. Furthermore, as shown in FIG. 22C, second conductors 72k are arranged with a pitch of a distance H that is three-and-a-half times the distance A of the pitch of the first conductors 71.

Thus, in a case where the second conductors 72i, 72j, or 72k are arranged with a pitch that is (an integer+½) times that of the first conductors 71, the proportion of bonding areas between the first insulating films 73 and the second insulating films 74 to the bonding area between the first semiconductor substrate 33 and the second semiconductor substrate 54 does not change.

5. Solid-State Imaging Device in Fourth Embodiment

Figure 23:
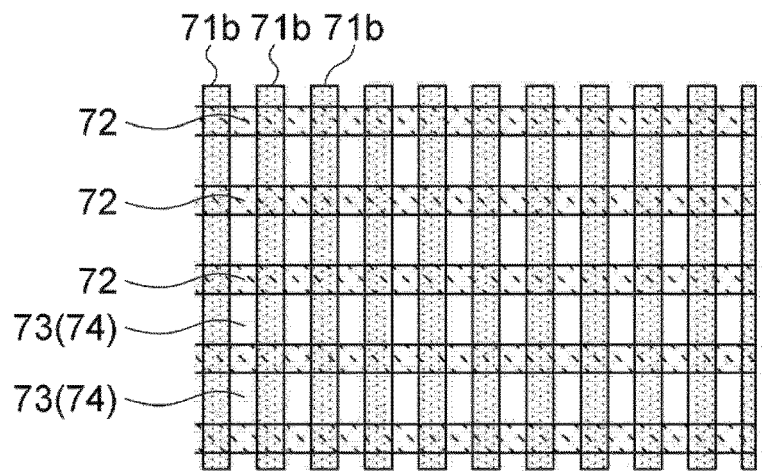
FIG. 23 is an explanatory diagram showing various configurations of the planar layout of a light-shielding layer in a solid-state imaging device according fourth to sixth embodiments to which the present technology is applied.
Figure 23:
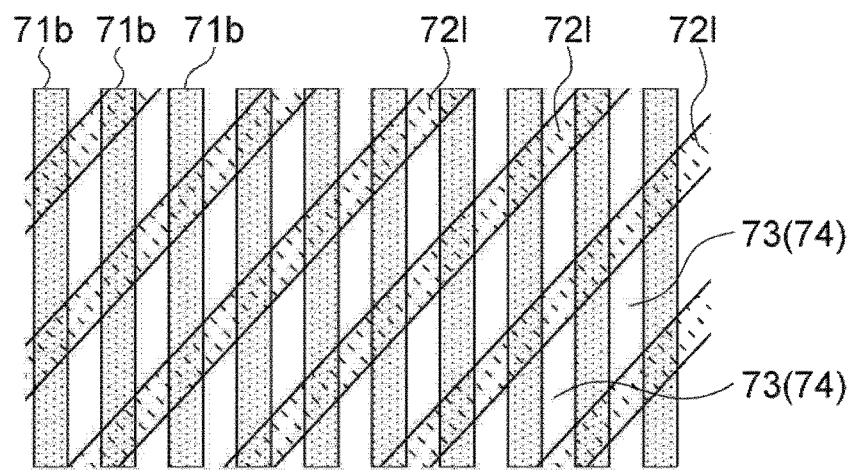
Figure 23:
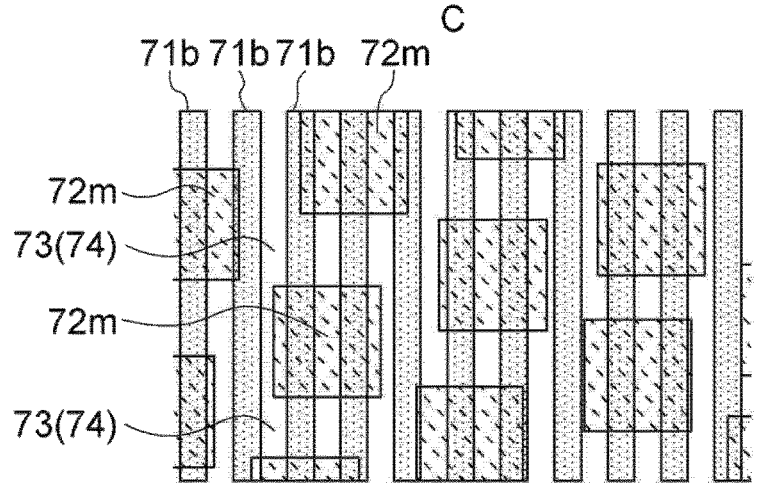

With reference to FIG. 23A, a fourth embodiment of a solid-state imaging device according to the present technology will be described. The solid-state imaging device of the fourth embodiment is different from the solid-state imaging device of the first embodiment in that the planar layout of a light-shielding layer 68 is different from the horizontally striped patterns shown in FIGS. 2A to 5B, and is arranged in a vertically striped pattern. Note that vertical means the up-and-down direction in FIG. 23A.

In the fourth embodiment, first conductors 71 or second conductors 72 on one side may be formed in a direction different from that of the first conductors 71 or the second conductors 72 on the other side. In this case, the first conductors 71 or the second conductors 72 on one side can be formed in a direction going straight to the first conductors 71 or the second conductors 72 on the other side.

FIG. 23A is a plan view of a layout in which a plurality of first conductors 71b and a plurality of second conductors 72 are arranged, as seen from the top. In FIG. 23A, in the plan view of the light-shielding layer 68, the first conductors 71b are arranged in a vertically striped pattern. Further, the second conductors 72 are arranged in a horizontally striped pattern as in the first embodiment. Note that the respective widths of the first conductors 71b and the second conductors 72 may be the same or may be different.

Even if the layout of the plurality of first conductors 71b and the plurality of second conductors 72 is changed like this, the solid-state imaging device of the fourth embodiment can prevent a change in the proportion of bonding areas between a plurality of first insulating films 73 and a plurality of second insulating films 74. As a result, the solid-state imaging device according to the fourth embodiment of the present technology can prevent variation in bonding strength.

6. Solid-State Imaging Device in Fifth Embodiment

With reference to FIG. 23B, a fifth embodiment of a solid-state imaging device according to the present technology will be described. The solid-state imaging device of the fifth embodiment is different from the solid-state imaging device of the first embodiment in that the planar layout of a light-shielding layer 68 is arranged in a diagonally striped pattern, which differs from the horizontally striped patterns shown in FIGS. 2A to 5B.

In the fifth embodiment, as in the fourth embodiment, first conductors 71 or second conductors 72 on one side may be formed in a direction different from that of the first conductors 71 or the second conductors 72 on the other side. In this case, the first conductors 71 or the second conductors 72 on one side can be formed in an oblique direction diagonally across the first conductors 71 or the second conductors 72 on the other side.

In FIG. 23B, in a plan view of the light-shielding layer 68, first conductors 71b are arranged in a vertically striped pattern, and second conductors 72l are arranged in a diagonally striped pattern arranged from the lower left to the upper right. Note that the respective widths of the first conductors 71b and the second conductors 72l may be the same or may be different.

Even if the layout of the plurality of first conductors 71b and the plurality of second conductors 72l is changed like this, the solid-state imaging device of the fifth embodiment can prevent a change in the proportion of bonding areas between a plurality of first insulating films 73 and a plurality of second insulating films 74. As a result, the solid-state imaging device according to the fifth embodiment of the present technology can prevent variation in bonding strength.

7. Solid-State Imaging Device in Sixth Embodiment

With reference to FIG. 23C, a sixth embodiment of a solid-state imaging device according to the present technology will be described. The solid-state imaging device of the sixth embodiment is different from the solid-state imaging device of the first embodiment in that the planar layout of a light-shielding layer 68 is different from the horizontally striped patterns shown in FIGS. 2A to 5B, and is arranged in a checkered pattern.

In FIG. 23C, in a plan view of the light-shielding layer 63, first conductors 71b are arranged in a vertically striped pattern, and second conductors 72m have a substantially square shape. Further, the second conductors 72m are arranged evenly on the undersides of the first conductors 71b, forming a checkered pattern. Note that the substantially square shape means a quadrangle including a square, and is not limited to a square. For example, in the sixth embodiment, if the first conductors 71b are in a rectangular shape and still can form a checkered pattern, the shape is included in the substantially square shape. Furthermore, if the first conductors 71b are in a diamond shape and still can form a checkered pattern, the shape is included in the substantially square shape. Moreover, the respective widths of the first conductors 71b and the second conductors 72m may be the same or may be different.

Even if the layout of the plurality of first conductors 71b and the plurality of second conductors 72m is changed like this, the solid-state imaging device of the sixth embodiment can prevent a change in the proportion of bonding areas between a plurality of first insulating films 73 and a plurality of second insulating films 74. As a result, the solid-state imaging device according to the sixth embodiment of the present technology can prevent variation in bonding strength.

8. Electronic Apparatus in Seventh Embodiment

An electronic apparatus according to a seventh embodiment of the present technology is an electronic apparatus equipped with a solid-state imaging device. The solid-state imaging device includes at least a first semiconductor substrate in which a plurality of first conductors is formed, and a second semiconductor substrate which is bonded to the first semiconductor substrate and in which a plurality of second conductors is formed. In a bonding plane between the first semiconductor substrate and the second semiconductor substrate, the first conductors and the second conductors are electrically connected, overlapping each other, and are arranged such that the proportion of areas where insulating films at which the first conductors are not formed and insulating films at which the second conductors are not formed are joined together is constant in the bonding area between the first semiconductor substrate and the second semiconductor substrate before and after the first semiconductor substrate and the second semiconductor substrate are bonded together. Furthermore, the electronic apparatus according to the seventh embodiment of the present technology may be an electronic apparatus equipped with the solid-state imaging device according to the first to sixth embodiments of the present technology.

Figure 24:
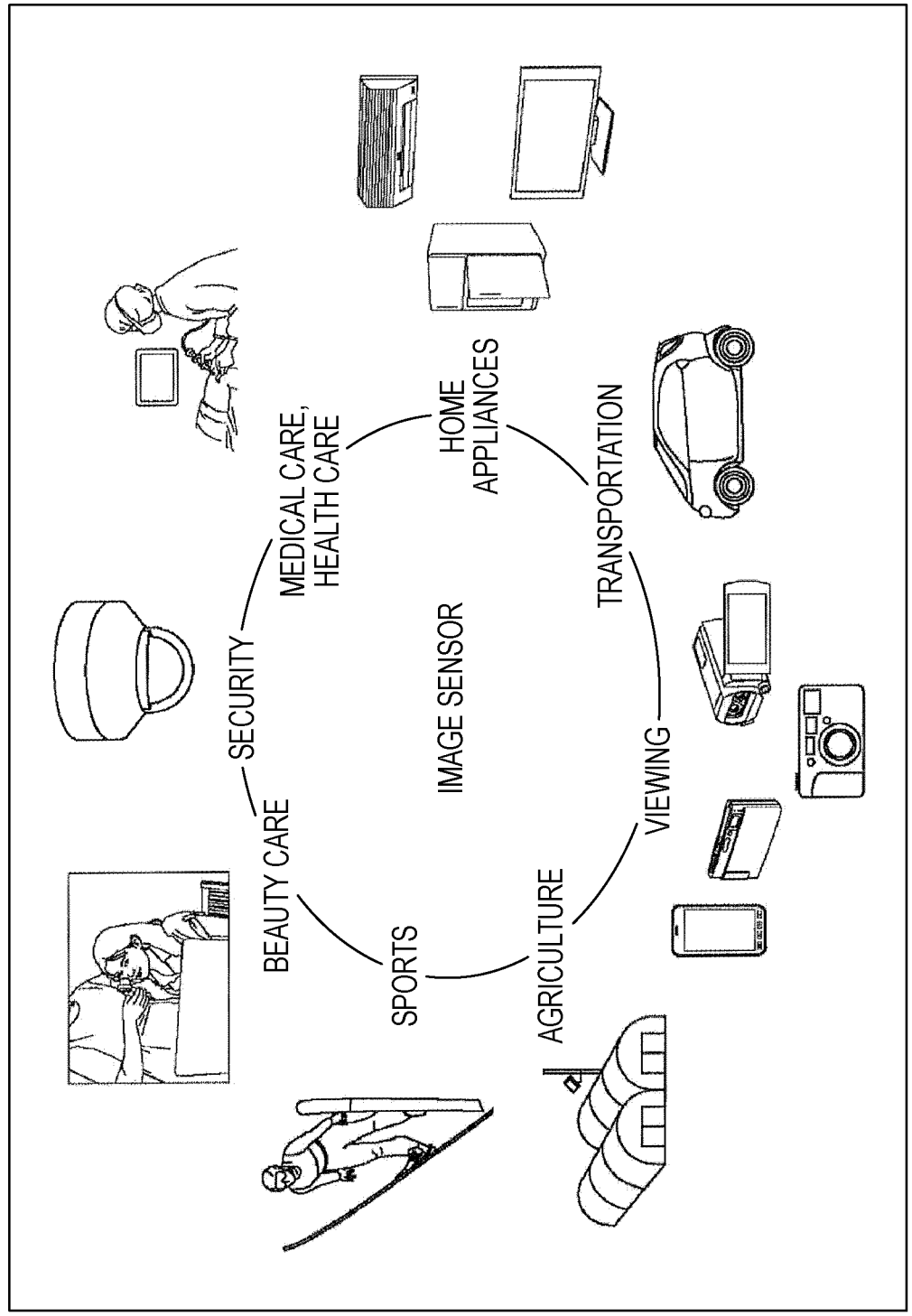
FIG. 24 is a diagram showing examples of use of the solid-state imaging device according to the first to sixth embodiments to which the present technology is applied.

9. Examples of Use of Solid-State Imaging Device to Which Present Technology is Applied FIG. 24 is a diagram showing examples of use of the solid-state imaging device according to the first to sixth embodiments of the present technology as an image sensor.

The solid-state imaging device according to the first to sixth embodiments described above can be used in various cases where light such as visible light, infrared light, ultraviolet light, and X-rays is sensed as described below, for example. Specifically, as shown in FIG. 24, the solid-state imaging device according to any one of the first to sixth embodiments can be used in an apparatus (for example, the electronic apparatus of the seventh embodiment described above) used, for example, in the field of viewing in which images provided for viewing are captured, the field of transportation, the field of home appliances, the field of medical care and healthcare, the field of security, the field of beauty care, the field of sports, the field of agriculture, or the like.

Specifically, in the field of viewing, the solid-state imaging device according to any one of the first to sixth embodiments can be used, for example, in an apparatus for capturing images provided for viewing, such as a digital camera, a smartphone, or a mobile phone with a camera function.

In the field of transportation, the solid-state imaging device according to any one of the first to sixth embodiments can be used, for example, in an apparatus provided for transportation use, such as an onboard sensor for imaging the front, back, surroundings, interior, etc. of an automobile, a surveillance camera for monitoring running vehicles and roads, or a distance measurement sensor for measuring distance between vehicles or others, for safe driving such as automatic stopping, recognition of a driver's conditions, or the like.

In the field of home appliances, the solid-state imaging device according to any one of the first to sixth embodiments can be used, for example, in an apparatus provided for a home appliance such as a television set, a refrigerator, or an air conditioner, in order to image a gesture of a user and perform apparatus control according to the gesture.

In the field of medical care and healthcare, the solid-state imaging device according to any one of the first to sixth embodiments can be used, for example, in an apparatus provided for medical care or healthcare use, such as an endoscope or an apparatus for performing angiography by receiving infrared light.

In the field of security, the solid-state imaging device according to any one of the first to sixth embodiments can be used, for example, in an apparatus provided for security use, such as a surveillance camera used for crime prevention or a camera used for person authentication.

In the field of beauty care, the solid-state imaging device according to any one of the first to sixth embodiments can be used, for example, in an apparatus provided for beauty care use, such as a skin measuring instrument that images a skin or a microscope that images a scalp.

In the field of sports, the solid-state imaging device according to any one of the first to sixth embodiments can be used, for example, in an apparatus provided for sports use, such as an action camera or a wearable camera for sports use, etc.

In the field of agriculture, the solid-state imaging device according to any one of the first to sixth embodiments can be used, for example, in an apparatus provided for agricultural use, such as a camera for monitoring the conditions of fields and crops.

Figure 25:
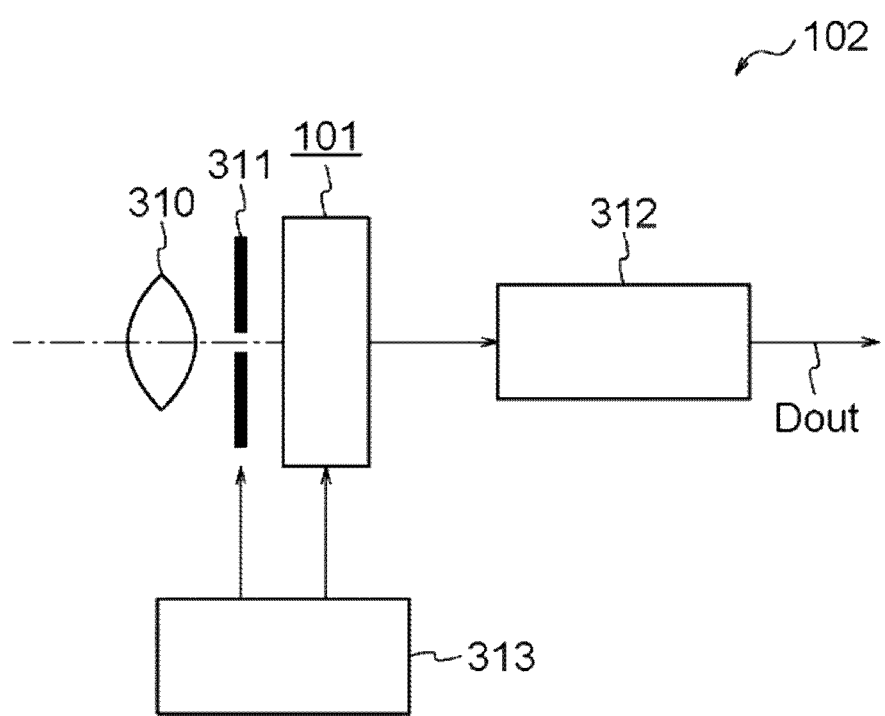
FIG. 25 is a functional block diagram of an example of an electronic apparatus to which the present technology is applied.

Next, an example of use of the solid-state imaging device according to the first to sixth embodiments of the present technology will be specifically described. For example, the solid-state imaging device 31 described above can be applied to all types of electronic apparatuses with an imaging function, such as camera systems including digital still cameras and video cameras, and mobile phones with an imaging function. FIG. 25 shows the schematic configuration of an electronic apparatus 102 (camera) as an example thereof. The electronic apparatus 102 is, for example, a video camera capable of capturing still images or moving images, and includes a solid-state imaging device 101, an optical system (optical lens) 310, a shutter 311, a drive unit 313 that drives the solid-state imaging device 101 and the shutter 311, and a signal processing unit 312.

The optical system 310 guides image light (incident light) from a subject to a pixel unit 101a of the solid-state imaging device 101. The optical system 310 may include a plurality of optical lenses. The shutter 311 controls a light-exposure period and a light-shielding period for the solid-state imaging device 101. The drive unit 313 controls the transfer operation of the solid-state imaging device 101 and the shutter operation of the shutter 311. The signal processing unit 312 performs various types of signal processing on signals output from the solid-state imaging device 101. An image signal Dout after the signal processing is stored in a storage medium such as memory or output to a monitor or the like.

Note that embodiments of the present technology are not limited to the above-described embodiments, and various modifications can be made without departing from the scope of the present technology.

Furthermore, the effects described in the present description are merely examples and nonlimiting, and other effects may be included.

Furthermore, the present technology can have the following configurations.

[1] A solid-state imaging device including:
  a first semiconductor substrate in which a plurality of first conductors is formed; and
  a second semiconductor substrate which is bonded to the first semiconductor substrate and in which a plurality of second conductors is formed,
  the solid-state imaging device including, in a bonding plane between the first semiconductor substrate and the second semiconductor substrate, regions where the first conductors and the second conductors overlap each other, regions where first insulating films formed at the first conductors and the second conductors overlap each other, regions where second insulating films formed at the second conductors and the first conductors overlap each other, and regions where the first insulating films and the second insulating films overlap each other, the solid-state imaging device being arranged such that a proportion of areas where the first insulating films and the second insulating films are bonded together to a bonding area between the first semiconductor substrate and the second semiconductor substrate is constant before and after the first semiconductor substrate and the second semiconductor substrate are bonded together.

[2] The solid-state imaging device according to [1] above, in which at least some of the plurality of first conductors are arranged substantially evenly, and at least some of the plurality of second conductors are arranged such that distance between the second conductors adjacent to each other varies in a region of the substantially even arrangement.

[3] The solid-state imaging device according to [1] or [2] above, in which at least some of the plurality of second conductors are arranged with a width of the second conductors that is an integral multiple of a repeating unit in which the first conductors are repeatedly arranged, in the substantially even arrangement region.

[4] The solid-state imaging device according to any one of [1] to [3] above, in which at least some of the plurality of second conductors are arranged such that a repeating unit in which the second conductors are repeatedly arranged is (an integer+½) times a repeating unit in which the first conductors are repeatedly arranged, in the substantially even arrangement region.

[5] The solid-state imaging device according to any one of [1] to [4] above, in which at least some of the plurality of second conductors are arranged such that one of the second conductors adjacent to each other is moved by a predetermined proportion of a minimum unit of repeating units in which the first conductors are repeatedly arranged, in the substantially even arrangement region.

[6] The solid-state imaging device according to [5] above, in which the predetermined proportion is ½.

[7] The solid-state imaging device according to any one of [1] to [6] above, in which the plurality of second conductors is formed in a direction different from a direction in which the plurality of first conductors is formed. [8] The solid-state imaging device according to any one of [1] to [7] above, in which the plurality of second conductors is formed in a direction going straight to a direction in which the plurality of first conductors is formed.

[9] A method of manufacturing a solid-state imaging device, including:

forming a plurality of first conductors in a first semiconductor substrate;

forming a plurality of second conductors in a second semiconductor substrate bonded to the first semiconductor substrate; and forming, in a bonding plane between the first semiconductor substrate and the second semiconductor substrate, regions where the first conductors and the second conductors overlap each other, regions where first insulating films formed at the first conductors and the second conductors overlap each other, regions where second insulating films formed at the second conductors and the first conductors overlap each other, and regions where the first insulating films and the second insulating films overlap each other, in which the solid-state imaging device is arranged such that a proportion of areas where the first insulating films and the second insulating films are bonded together to a bonding area between the first semiconductor substrate and the second semiconductor substrate is constant before and after the first semiconductor substrate and the second semiconductor substrate are bonded together.

[10] An electronic apparatus equipped with a solid-state imaging device, the solid-state imaging device including at least a first semiconductor substrate in which a plurality of first conductors is formed, and a second semiconductor substrate which is bonded to the first semiconductor substrate and in which a plurality of second conductors is formed, the solid-state imaging device including, in a bonding plane between the first semiconductor substrate and the second semiconductor substrate, regions where the first conductors and the second conductors overlap each other, regions where first insulating films formed at the first conductors and the second conductors overlap each other, regions where second insulating films formed at the second conductors and the first conductors overlap each other, and regions where the first insulating films and the second insulating films overlap each other, the solid-state imaging device being arranged such that a proportion of areas where the first insulating films and the second insulating films are bonded together to a bonding area between the first semiconductor substrate and the second semiconductor substrate is constant before and after the first semiconductor substrate and the second semiconductor substrate are bonded together.

REFERENCE SIGNS LIST 1, 1a to 1c, 31 Solid-state imaging device
2 Pixel
3, 23, 34 Pixel array (pixel region)
4 Vertical drive circuit
5 Column signal processing circuit
6 Horizontal drive circuit
7 Output circuit
8, 24, 24-1, 24-2 Control circuit
9 Vertical signal line
10 Horizontal signal line
21, 33 First semiconductor substrate
22, 54 Second semiconductor substrate
25, 55 Logic circuit
26 First semiconductor chip part
28 Second semiconductor chip part
30, 50 Semiconductor well region
32 Laminated semiconductor chip
33a Front
35a to 35d, 36, 57a to 57c, 58, 902 to 904 wire
37, 59 Multilayer wiring layer
38 Insulating film
39 Light-shielding film
40 Bonding plane
41 Optical black region
42 Effective pixel array
43 Planarizing film
44 Color filter
45 On-semiconductor-chip lens
47, 48 P-type semiconductor region
49, 61 Source-drain region 51, 63 Element isolation region
52, 64 Conductive via
53, 56, 66 Interlayer insulating film
62 Gate electrode
68 Light-shielding layer
71, 71a First conductor
72, 72a, 72b, 72c, 72d, 72e Second conductor
73 First insulating film
74 Second insulating film
78, 79, 84, 85 Opening
75, 81 Cu diffusion barrier insulating film
76, 82 First insulating film
77, 83 Second insulating film
80, 86 Via hole
900, 901 Insulating thin film
PD Photodiode
Tr1, Tr2 Pixel transistor
M1 to M5, M13, M14 Metal
FD Floating diffusion
Tr11 to Tr14 MOS transistor

What is claimed is:

1. A solid-state imaging device, comprising:
a first semiconductor substrate in which a plurality of first conductors is formed; and
a second semiconductor substrate which is bonded to the first semiconductor substrate and in which a plurality of second conductors is formed,
wherein the solid-state imaging device including, in a bonding plane between the first semiconductor substrate and the second semiconductor substrate, regions where the plurality of first conductors and the plurality of second conductors overlap each other for an entire bonding surface for each first conductor of the plurality of first conductors and each second conductor of the plurality of second conductors, regions where first insulating films and the plurality of second conductors overlap each other without the plurality of second conductors overlapping with at least a first conductor of the plurality of first conductors for an entire bonding surface for each first conductor of the plurality of first conductors and each second conductor of the plurality of second conductors, regions where second insulating films and the plurality of first conductors overlap each other without the plurality of first conductors overlapping with at least a second conductor of the plurality of second conductors for an entire bonding surface for each first conductor of the plurality of first conductors and each second conductor of the plurality of second conductors, and regions where the first insulating films and the second insulating films overlap each other, and
wherein the solid-state imaging device being arranged such that a proportion of areas where the first insulating films and the second insulating films are bonded together to a bonding area between the first semiconductor substrate and the second semiconductor substrate is constant before and after the first semiconductor substrate and the second semiconductor substrate are bonded together.

2. The solid-state imaging device according to claim 1, wherein
at least some of the plurality of first conductors are arranged substantially evenly, and
at least some of the plurality of second conductors are arranged such that a distance between adjacent second conductors of the plurality of second conductors varies in a region of a substantially even arrangement.

3. The solid-state imaging device according to claim 2, wherein at least some of the plurality of second conductors are arranged such that one of adjacent second conductors is moved by a predetermined proportion of a minimum unit of repeating units in which the plurality of first conductors are repeatedly arranged, in the substantially even arrangement region.

4. The solid-state imaging device according to claim 3, wherein the predetermined proportion is ½.

5. The solid-state imaging device according to claim 1, wherein at least some of the plurality of second conductors are arranged with a width of the plurality of second conductors that is an integral multiple of a repeating unit in which the plurality of first conductors is repeatedly arranged, in a substantially even arrangement region.

6. The solid-state imaging device according to claim 1, wherein at least some of the plurality of second conductors are arranged such that a repeating unit in which the plurality of second conductors is repeatedly arranged is (an integer+½) times a repeating unit in which the first conductors are repeatedly arranged, in a substantially even arrangement region.

7. The solid-state imaging device according to claim 1, wherein the plurality of second conductors is formed in a direction different from a direction in which the plurality of first conductors is formed.

8. The solid-state imaging device according to claim 1, wherein the plurality of second conductors is formed in a direction going straight to a direction in which the plurality of first conductors is formed.

9. A method of manufacturing a solid-state imaging device, comprising:
forming a plurality of first conductors in a first semiconductor substrate;
forming a plurality of second conductors in a second semiconductor substrate bonded to the first semiconductor substrate; and
forming, in a bonding plane between the first semiconductor substrate and the second semiconductor substrate, regions where the plurality of first conductors and the plurality of second conductors overlap each other for an entire bonding surface for each first conductor of the plurality of first conductors and each second conductor of the plurality of second conductors, regions where first insulating films and the plurality of second conductors overlap each other without the plurality of second conductors overlapping with at least a first conductor of the plurality of first conductors for an entire bonding surface for each first conductor of the plurality of first conductors and each second conductor of the plurality of second conductors, regions where second insulating films and the plurality of first conductors overlap each other without the plurality of first conductors overlapping with at least a second conductor of the plurality of second conductors for an entire bonding surface for each first conductor of the plurality of first conductors and each second conductor of the plurality of second conductors, and regions where the first insulating films and the second insulating films overlap each other,
wherein the solid-state imaging device is arranged such that a proportion of areas where the first insulating films and the second insulating films are bonded together to a bonding area between the first semiconductor substrate and the second semiconductor substrate is constant before and after the first semiconductor substrate and the second semiconductor substrate are bonded together.

10. The method according to claim 9, further comprising:
arranging at least some of the plurality of first conductors substantially evenly, and
arranging at least some of the plurality of second conductors such that a distance between adjacent second conductors of the plurality of second conductors varies in a region of a substantially even arrangement.

11. The method according to claim 10, further comprising arranging at least some of the plurality of second conductors such that one of adjacent second conductors is moved by a predetermined proportion of a minimum unit of repeating units in which the plurality of first conductors is repeatedly arranged, in the substantially even arrangement region.

12. The method according to claim 11, wherein the predetermined proportion is ½.

13. The method according to claim 9, further comprising arranging at least some of the plurality of second conductors with a width of the plurality of second conductors that is an integral multiple of a repeating unit in which the plurality of first conductors is repeatedly arranged, in a substantially even arrangement region.

14. The method according to claim 9, further comprising arranging at least some of the plurality of second conductors such that a repeating unit in which the plurality of second conductors is repeatedly arranged is (an integer+½) times a repeating unit in which the first conductors are repeatedly arranged, in a substantially even arrangement region.

15. An electronic apparatus equipped with a solid-state imaging device, the solid-state imaging device comprising:
at least a first semiconductor substrate in which a plurality of first conductors is formed, and
a second semiconductor substrate which is bonded to the first semiconductor substrate and in which a plurality of second conductors is formed,
wherein the solid-state imaging device including, in a bonding plane between the first semiconductor substrate and the second semiconductor substrate, regions where the plurality of first conductors and the plurality of second conductors overlap each other without the plurality of second conductors overlapping with at least a first conductor of the plurality of first conductors for an entire bonding surface for each first conductor of the plurality of first conductors and each second conductor of the plurality of second conductors, regions where first insulating films and the plurality of second conductors overlap each other for an entire bonding surface for each second conductor of the plurality of second conductors, regions where second insulating films and the plurality of first conductors overlap each other without the plurality of first conductors overlapping with at least a second conductor of the plurality of second conductors for an entire bonding surface for each first conductor of the plurality of first conductors and each second conductor of the plurality of second conductors, and regions where the first insulating films and the second insulating films overlap each other, and
wherein the solid-state imaging device being arranged such that a proportion of areas where the first insulating films and the second insulating films are bonded together to a bonding area between the first semiconductor substrate and the second semiconductor substrate is constant before and after the first semiconductor substrate and the second semiconductor substrate are bonded together.

16. The electronic apparatus according to claim 15, wherein
at least some of the plurality of first conductors are arranged substantially evenly, and
at least some of the plurality of second conductors are arranged such that a distance between adjacent second conductors of the plurality of second conductors varies in a region of a substantially even arrangement.

17. The electronic apparatus according to claim 16, wherein at least some of the plurality of second conductors are arranged such that one of adjacent second conductors is moved by a predetermined proportion of a minimum unit of repeating units in which the plurality of first conductors are repeatedly arranged, in the substantially even arrangement region.

18. The electronic apparatus according to claim 17, wherein the predetermined proportion is ½.

19. The electronic apparatus according to claim 15, wherein at least some of the plurality of second conductors are arranged with a width of the plurality of second conductors that is an integral multiple of a repeating unit in which the plurality of first conductors is repeatedly arranged, in a substantially even arrangement region.

20. The electronic apparatus according to claim 15, wherein at least some of the plurality of second conductors are arranged such that a repeating unit in which the plurality of second conductors is repeatedly arranged is (an integer+½) times a repeating unit in which the first conductors are repeatedly arranged, in a substantially even arrangement region.

* * * * *